United States Patent
Fukuzumi et al.

(10) Patent No.: US 9,064,975 B2
(45) Date of Patent: Jun. 23, 2015

(54) SHIFT REGISTER MEMORY AND METHOD OF MANUFACTURING THE SAME

(75) Inventors: Yoshiaki Fukuzumi, Yokohama (JP); Masaru Kito, Kuwana (JP); Tomoko Fujiwara, Odawara (JP); Kaori Kawasaki, Yokohama (JP); Hideaki Aochi, Kawasaki (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 546 days.

(21) Appl. No.: 13/409,652

(22) Filed: Mar. 1, 2012

(65) Prior Publication Data

US 2013/0020627 A1   Jan. 24, 2013

(30) Foreign Application Priority Data

Jul. 20, 2011   (JP) ................... 2011-159082

(51) Int. Cl.
| | |
|---|---|
| H01L 29/765 | (2006.01) |
| H01L 21/84 | (2006.01) |
| H01L 27/10 | (2006.01) |
| H01L 27/115 | (2006.01) |
| H01L 27/12 | (2006.01) |
| G11C 19/00 | (2006.01) |

(52) U.S. Cl.
CPC ............... *H01L 21/84* (2013.01); *H01L 27/10* (2013.01); *H01L 27/11517* (2013.01); *H01L 27/1203* (2013.01); *G11C 19/00* (2013.01)

(58) Field of Classification Search
CPC ............ H01L 27/11521; H01L 27/115; H01L 27/112
USPC ................... 257/316, E21.209, 30, 214, 244, 257/E27.103
See application file for complete search history.

(56) References Cited

U.S. PATENT DOCUMENTS

| | | |
|---|---|---|
| 6,834,005 B1 | 12/2004 | Parkin |
| 2011/0267868 A1 | 11/2011 | Fukuzumi et al. |

OTHER PUBLICATIONS

U.S. Appl. No. 13/238,198, filed Sep. 21, 2011, Hirofumi Morise.
U.S. Appl. No. 13/282,605, filed Oct. 27, 2011, Hirofumi Morise.
Stuart S. P. Parkin et al., "Magnetic Domain-Wall Racetrack Memory", Science, Apr. 11, 2008, vol. 320, pp. 190-194.
Katsuhiko Nishiguchi et al., "Room-temperature single-electron transfer and detection with silicon nanodevices", IEDM 2004, NTT, © 2004, 4 Pages.
Office Action issued Apr. 8, 2014 in Japanese Patent Application No. 2011-159082 (with English translation).

*Primary Examiner* — Minchul Yang
(74) *Attorney, Agent, or Firm* — Oblon, McClelland, Maier & Neustadt, L.L.P.

(57) ABSTRACT

In one embodiment, a shift register memory includes first and second control electrodes extending in a first direction parallel to a surface of a substrate, and facing each other in a second direction perpendicular to the first direction. The memory further includes a plurality of first floating electrodes provided in a line on a first control electrode side between the first and second control electrodes. The memory further includes a plurality of second floating electrodes provided in a line on a second control electrode side between the first and second control electrodes. Each of the first and second floating electrodes has a planar shape which is mirror-asymmetric with respect to a plane perpendicular to the first direction.

17 Claims, 16 Drawing Sheets

SHIFT REGISTER MEMORY AND METHOD OF MANUFACTURING THE SAME

CROSS REFERENCE TO RELATED APPLICATION

This application is based upon and claims the benefit of priority from the prior Japanese Patent Application No. 2011-159082, filed on Jul. 20, 2011, the entire contents of which are incorporated herein by reference.

FIELD

Embodiments described herein relate to a shift register memory and a method of manufacturing the same.

BACKGROUND

A shift register memory has been proposed to improve the capacity of a memory. The shift register memory does not include a selection element and a data line for each memory element, but transmits data stored in memory elements to the position of a sensor or a data line. Therefore, the shift register memory has the possibility that the memory elements can be arranged with high density and the memory capacity is significantly increased.

In order to utilize this advantage, it is not preferable to provide a control electrode for each bit (each digit) in the shift register memory. Therefore, it is necessary to perform a shift operation with the desired number of digits by adding an action to all length of bit string (shift register).

However, it is not easy to shift all digit data without any error. In particular, in a case of a high-capacity memory, each shift register includes 100 or more digits, and the physical length of the shift register also must be increased. In this case, it is considered that the possibility of an operation error is increased due to the distortion of a signal waveform caused by a capacitance or inductance component.

As described above, in order to achieve a high-capacity shift register memory, a shift register is required to have high reliability such that data of each bit can be transmitted without any error by an operation on all bit string. However, it is considered that such shift operation is difficult for a conventional shift register.

DETAILED DESCRIPTION

Embodiments will now be explained with reference to the accompanying drawings.

An embodiment described herein is a shift register memory including first and second control electrodes extending in a first direction parallel to a surface of a substrate, and facing each other in a second direction perpendicular to the first direction. The memory further includes a plurality of first floating electrodes provided in a line on a first control electrode side between the first and second control electrodes. The memory further includes a plurality of second floating electrodes provided in a line on a second control electrode side between the first and second control electrodes. Each of the first and second floating electrodes has a planar shape which is mirror-asymmetric with respect to a plane perpendicular to the first direction.

First Embodiment

Figure 1:
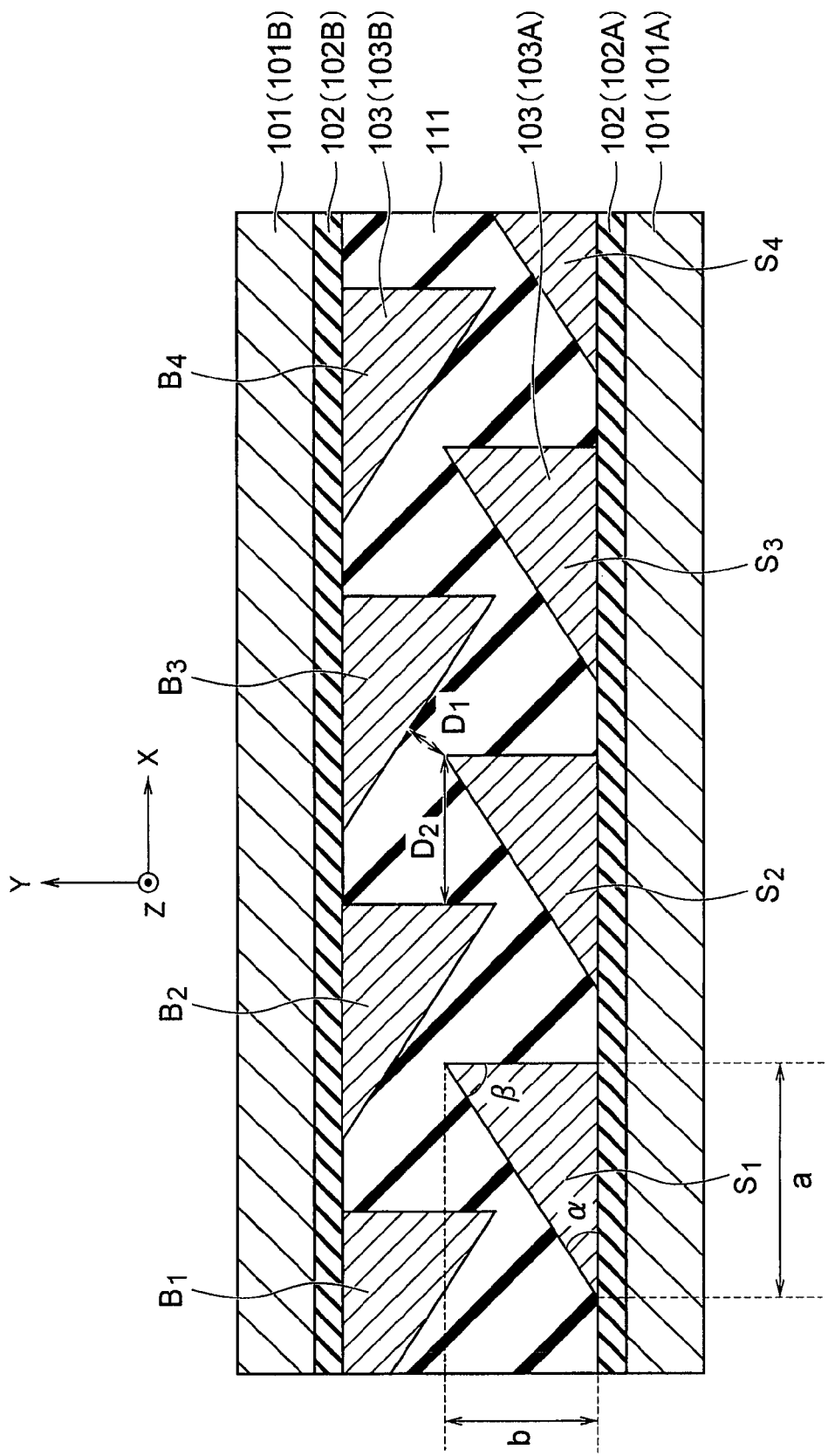
FIG. 1 is a plan view illustrating a structure of a shift register memory of a first embodiment.

FIG. 1 is a plan view illustrating the structure of a shift register memory of a first embodiment.

The shift register memory of this embodiment includes one or more shift registers. FIG. 1 illustrates one shift register forming the shift register memory of this embodiment.

The shift register illustrated in FIG. 1 includes a pair of control electrodes 101 arranged on a substrate, and a plurality of floating electrodes 103 arranged between the control electrodes 101. FIG. 1 illustrates X and Y directions which are parallel to the principal surface of the substrate and are perpendicular to each other, and illustrates a Z direction which is perpendicular to the principal surface of the substrate. The X and Y directions are examples of first and second directions, respectively.

FIG. 1 illustrates first and second control electrode 101A and 101B as the control electrodes 101. The first and second control electrodes 101A and 101B extend in the X direction and face each other in the Y direction.

FIG. 1 further illustrates a plurality of first floating electrodes 103A and a plurality of second floating electrodes 103B as the floating electrodes 103. The first floating electrodes 103A are arranged in a line on the side of the first control electrode 101A between the control electrodes 101, and the second floating electrodes 103B are arranged in a line on the side of the second control electrode 101B between the control electrodes 101.

One of the first and second floating electrodes 103A and 103B is used as a memory layer for storing charges and the other floating electrode is used as a buffer layer for transmitting the charges. In this embodiment, for convenience, the first floating electrode 103A is referred to as a memory layer and the second floating electrode 103B is referred to as a buffer layer. In FIG. 1, the first floating electrodes 103A are sequentially represented by $S_1$ to $S_4$ from the −X direction and the second floating electrodes 103B are sequentially represented by $B_1$ to $B_4$ from the −X direction.

The shift register illustrated in FIG. 1 further includes insulators 102 which are formed between the control electrodes 101 and the floating electrodes 103. The insulators 102 in this embodiment have a permittivity higher than that of a silicon oxide film. For example, the insulators 102 are silicon nitride films or high-k insulators. The insulators 102 are an example of first insulating layers. The insulators 102 cause each floating electrode 103 to electrically float from the control electrodes 101.

The shift register illustrated in FIG. 1 further includes an insulator 111 buried between the control electrodes 101 to separate the floating electrodes 103 each other. The insulator 111 is, for example, a silicon oxide film. The insulator 111 is an example of a second insulating layer. The floating electrodes 103 are electrically insulated from each other by the insulator 111.

In FIG. 1, the insulator 102 between the first control electrode 101A and the first floating electrodes 103A is represented by reference numeral 102A, and the insulator 102 between the second control electrode 101B and the second floating electrodes 103B is represented by reference numeral 102B. Specifically, the insulators 102 are also formed on the second and third sides of each floating electrode 103, which will be described below (see FIGS. 3 and 4).

Next, the planar shape of each floating electrode 103 will be described.

As illustrated in FIG. 1, the floating electrode 103 has a planar shape which is mirror-asymmetric with respect to the plane perpendicular to the X direction. That is, in FIG. 1, the floating electrode 103 has a planar shape which is asymmetric with respect to the vertical direction.

Specifically, the floating electrode 103 has a right triangle shape including a first side which is parallel to the X direction, a second side which is parallel to the Y direction, and a third side which is not parallel to the X direction and the Y direction in a plan view. The first side is disposed so as to come into contact with the insulator 102. The second side is disposed closer to the +X direction than the first side.

In FIG. 1, the length of the first side is represented by "a" and the length of the second side is represented by "b". The angle formed between the first side and the third side is represented by "α" and the angle formed between the second side and the third side is represented by "β". In this embodiment, the length a is set to be greater than the length b (a>b) and the angle α is set to be smaller than the angle β (α<β).

In this embodiment, the first floating electrodes 103A have the same planar shape. However, the first floating electrodes 103A with two or more different shapes may be included. Similarly, the second floating electrodes 103B have the same planar shape. However, the second floating electrodes 103B with two or more different shapes may be included. In addition, the second floating electrode 103B has a planar shape which is mirror-symmetric to the first floating electrode 103A. However, the second floating electrode 103B may have other shapes.

Next, the arrangement of the floating electrodes 103 will be described.

In FIG. 1, the first floating electrodes 103A and the second floating electrode 103B are alternately arranged along the X direction. That is, the floating electrodes 103 are alternately arranged along the X direction in the order of floating electrodes 103A, 103B, 103A, 103B, . . . . In addition, the distance between the first floating electrode 103A and the second floating electrode 103B adjacent to each other is constant.

Next, the positional relation between the floating electrodes 103, for example, the first floating electrode $S_2$ and the second floating electrodes $B_2$ and $B_3$ will be described.

The floating electrode $B_3$ is adjacent to the side of the floating electrode $S_2$ which faces the +X direction and the floating electrode $B_2$ is adjacent to the side of the floating electrode $S_2$ which faces the −X direction. In FIG. 1, the distance between an angular portion β of the floating electrode $S_2$ and the floating electrode $B_3$ is represented by $D_1$ and the distance between the angular portion β of the floating electrode $S_2$ and the floating electrode $B_2$ is represented by $D_2$.

In this embodiment, the distance $D_1$ is set to be shorter than the distance $D_2$ ($D_1<D_2$). Preferably, the distance $D_1$ is set to be significantly shorter than the distance $D_2$ ($D_1<<D_2$). This structure has the advantage that the charges stored in the floating electrode $S_2$ can be substantially transmitted only to the floating electrode $B_3$ of the floating electrodes $B_2$ and $B_3$, which will be described below. When the length a is set to be longer than the length b, it is easy to achieve arrangement satisfying the condition $D_1<D_2$ (furthermore $D_1<<D_2$), as compared to when the length a is set to be shorter than the length b.

When the distance $D_1$ is too long, it is difficult to obtain the tunnel effect of charges. When the distance $D_1$ is too short, the tunnel effect of charges is excessive. Therefore, in this embodiment, the distance $D_1$ is set to, for example, 3 nm to 5 nm. In addition, in this embodiment, the distance between the first control electrode 101A and the first floating electrode 103A or the distance between the second control electrode 101B and the second floating electrode 103B is also set to, for example, 3 nm to 5 nm.

In this embodiment, each floating electrode 103 has a right triangle shape in a plan view. However, each floating electrode 103 may have any shape as long as it has a sharp end portion, such as the angular portion β, in the vicinity of the floating electrode 103 which is adjacent thereto in the +X direction. An example of the floating electrode 103 will be described in the following third embodiment.

(1) Operating Principle of Shift Register Memory

Next, the operating principle of the shift register memory will be described with reference to FIGS. 2A to 2D. FIGS. 2A to 2D are plan views illustrating the operating principle of the shift register memory of the first embodiment.

Figure 2A:
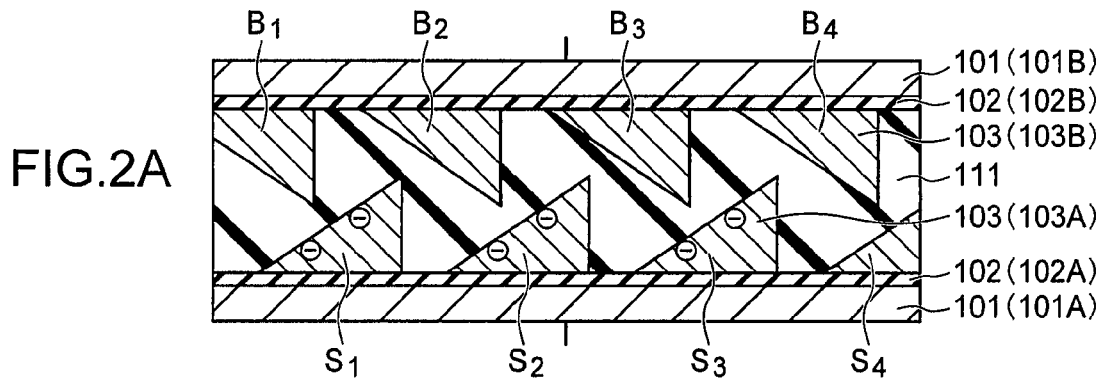
FIGS. 2A to 2D are plan views illustrating an operating principle of the shift register memory of the first embodiment.

FIG. 2A Illustrates a state in which each of the first floating electrodes 103A holds electrons.

Figure 2B:
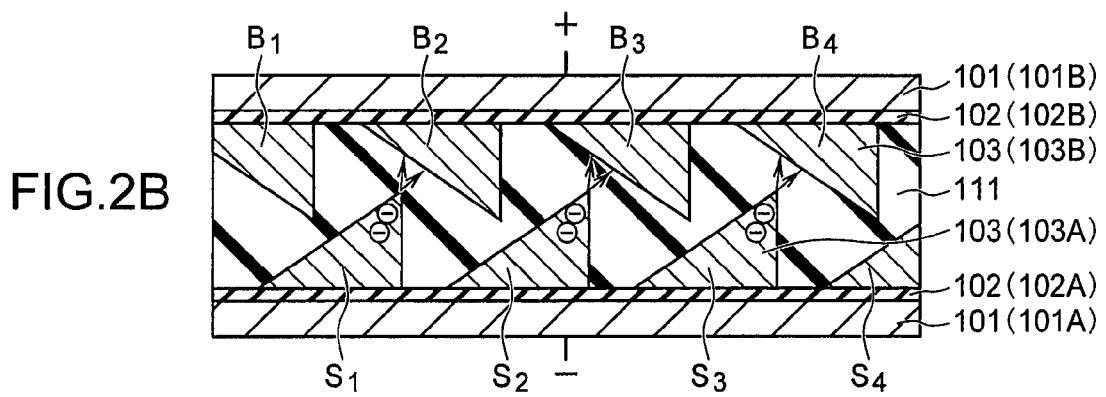

In this state, when the positive voltage is applied to the second control electrode 101B and the negative voltage is applied to the first control electrode 101A, a strong electric field is formed between the angular portion β of each of the first floating electrodes 103A and the second floating electrode 103B which is adjacent thereto in the +X direction. As a result, the electrons in each of the first floating electrodes 103A are emitted (transmitted) to the second floating electrode 103B which is adjacent to the first floating electrode 103A in the +X direction by field emission (FIG. 2B). In FIG. 2B, the electrons in the first floating electrodes $S_1$, $S_2$, and $S_3$ are emitted to the second floating electrodes $B_2$, $B_3$, and $B_4$, respectively.

In this embodiment, the electrons in each of the first floating electrodes 103A are substantially emitted only to the second floating electrode 103B which is adjacent to the first floating electrodes 103A in the +X direction, but are not emitted to the second floating electrode 103B which is adjacent to the first floating electrodes 103A in the −X direction. This is because an electric field stronger than that between the first floating electrode 103A and the second floating electrode 103B which is adjacent to the first floating electrode 103A in the −X direction is formed between the first floating electrode 103A and the second floating electrode 103B which is adjacent to the first floating electrodes 103A in the +X direction, according to the condition $D_1<D_2$ (preferably, $D_1<<D_2$).

Since the overlap area between the first control electrode 101A and the first floating electrodes 103A or the overlap area between the second control electrode 101B and the second floating electrodes 103B is large, capacitive coupling is likely to occur between the electrodes. However, since the smooth surfaces of the electrodes face each other, the electric field can be suppressed such that the concentration of the electric field and electron exchange do not occur between the electrodes. Therefore, in the shift register, the electrons are exchanged between the floating electrodes 103.

Figure 2C:
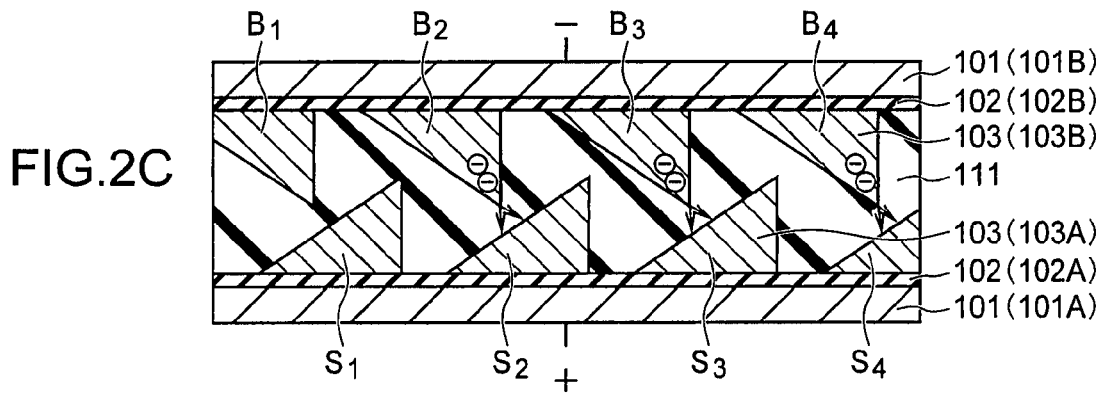

Next, in the state illustrated in FIG. 2B, when the positive voltage is applied to the first control electrode 101A and the negative voltage is applied to the second control electrode 101B, a strong electric field is formed between the angular portion β of each of the second floating electrodes 103B and the first floating electrode 103A which is adjacent thereto in the +X direction. As a result, the electrons in the second floating electrode 103B are emitted (transmitted) to the first floating electrode 103A which is adjacent to the second floating electrode 103B in the +X direction by field emission (FIG. 2C). In FIG. 2C, the electrons in the second floating electrodes $B_2$, $B_3$, and $B_4$ are emitted to the first floating electrodes $S_2$, $S_3$, and $S_4$, respectively.

Figure 2D:
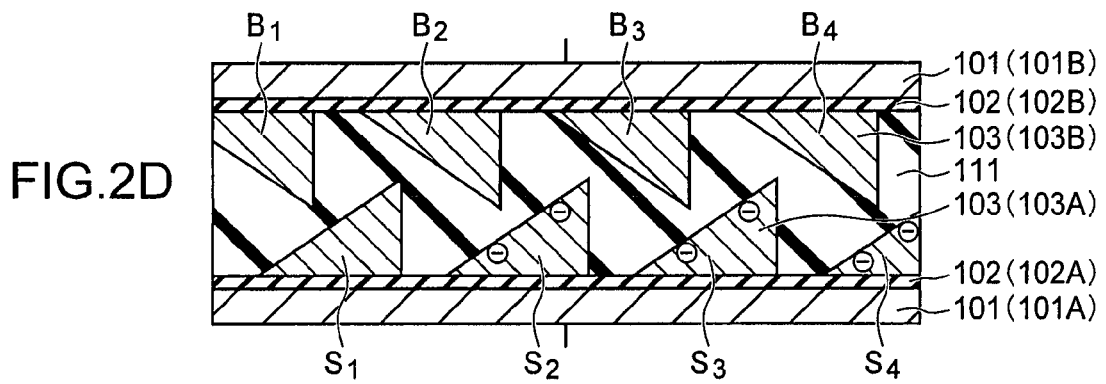

As described above, the electrons in the first floating electrodes $S_1$, $S_2$, and $S_3$ are transmitted to the first floating electrodes $S_2$, $S_3$, and $S_4$ which are adjacent to the first floating electrodes $S_1$, $S_2$, and $S_3$ in the +X direction, respectively (FIG. 2D).

As described above, in this embodiment, a process of respectively applying the positive voltage and the negative voltage to the control electrodes 101A and 101B and a process of respectively applying the negative voltage and the positive voltage to the control electrodes 101A and 101B are alternately performed to transmit charges in each memory layer (103A) to another memory layer which is adjacent to the memory layer in the +X direction. In this embodiment, it is possible to shift stored data using the above-mentioned structure.

In the above description, the voltage is applied to both the first and second control electrodes 101A and 101B. However, no voltage (0 V) may be applied to one of the first and second control electrodes 101A and 101B and a voltage may be applied only to the other control electrode as long as the electric field can be formed between the first and second control electrodes 101A and 101B.

(2) Examples of Structure of Memory Layer in First Stage of Shift Register

Next, examples of the structure of the memory layer in the first stage of the shift register will be described with reference to FIGS. 3 to 5.

Figure 3:
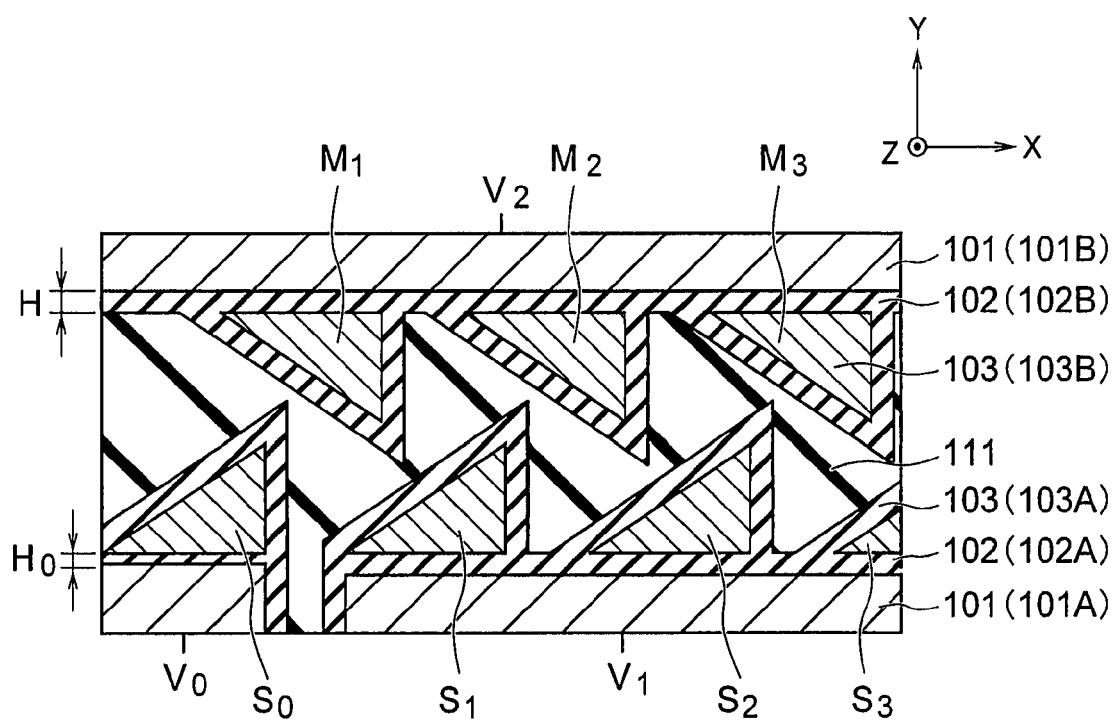
FIGS. 3 and 4 are plan views illustrating first and second examples of a memory layer in a first stage of the shift register of the first embodiment, respectively.

FIG. 3 is a plan view illustrating a first example of the memory layer in the first stage of the shift register of the first embodiment.

In FIG. 3, the memory layer in the first stage is represented by reference numeral $S_0$. In the shift register illustrated in FIG. 3, first, data is written to the memory layer $S_0$. Then, the data is sequentially transmitted to a buffer layer $B_1$, a memory layer $S_1$, a buffer layer $B_2$, a memory layer $S_2$, . . . .

In this example, the first control electrode 101A is divided into a control electrode for the memory layer $S_0$ and a control electrode for the other memory layers. In this example, electrons are injected from the control electrode for the memory layer $S_0$ into the memory layer $S_0$. In this way, data is written to the memory layer $S_0$.

In addition, in this example, in order to facilitate the injection of the electrons into the memory layer $S_0$, the following structures can be used. 1) Only the insulator 102 (for example, a silicon oxide film) between the memory layer $S_0$ and the control electrode 101A has a permittivity lower than that of the other insulators 102. 2) The thickness $H_0$ of the insulator 102 between the memory layer $S_0$ and the control electrode 101A is smaller than the thickness H of the other insulators 102. FIG. 3 illustrates the structure of 2). The structure of 1) and the structure of 2) may be combined with each other.

The voltage applied to the control electrode 101A other than the control electrode 101A for the memory layer $S_0$ is represented by $V_1$ and the voltage applied to the control electrode 101B is represented by $V_2$. In addition, the voltage applied to the control electrode 101A for the memory layer $S_0$ is represented by $V_0$.

In a case in which the structure of 1) or 2) is not used, when electrons are injected into the memory layer $S_0$, the absolute value of the voltage $V_0$ is set to be greater than that of the voltage $V_1$ ($|V_0|>|V_1|$). The reason is that the voltage $V_1$ is set to a value at which electrons cannot be injected from the control electrode 101A into the memory layer and the voltage $V_0$ during the injection of electrons needs to be set to a value at which electrons can be injected from the control electrode 101A into the memory layer $S_0$.

In addition, in the case in which the structure of 1) or 2) is not used, when the memory layer $S_0$ is used for transmitting electrons, similarly to the other memory layers, the absolute value of the voltage $V_0$ is set to be equal to or smaller than that of the voltage $V_1$ ($|V_0|\leq|V_1|$).

When the structure of 1) or 2) is used, a relation other than the above is established between the voltage $V_0$ and the voltage $V_1$.

It is necessary to consider the material or thickness of the insulator 102 between the memory layer $S_0$ and the control electrode 101A for the relation between the voltage $V_0$ and the voltage $V_1$ when electrons are injected into the memory layer $S_0$. Therefore, the relation between the voltage $V_0$ and the voltage $V_1$ varies depending on the design of the shift register.

For example, in the case in which the structure of 2) is used, when the memory layer $S_0$ is used for transmitting electrons, similarly to the other memory layers, the absolute value of the voltage $V_0$ is set to be smaller than that of the voltage $V_1$ ($|V_0|<|V_1|$). The reason why $|V_0|=|V_1|$ is excluded is as follows. When $|V_0|$ and $|V_1|$ are set to the same value, strong capacitive coupling occurs between the memory layer $S_0$ and the control electrode 101A, according to the relation of the material or thickness of the insulator 102 between the memory layer $S_0$ and the control electrode 101A. As a result, an excessively high voltage is applied to the memory layer $S_0$.

Figure 4:
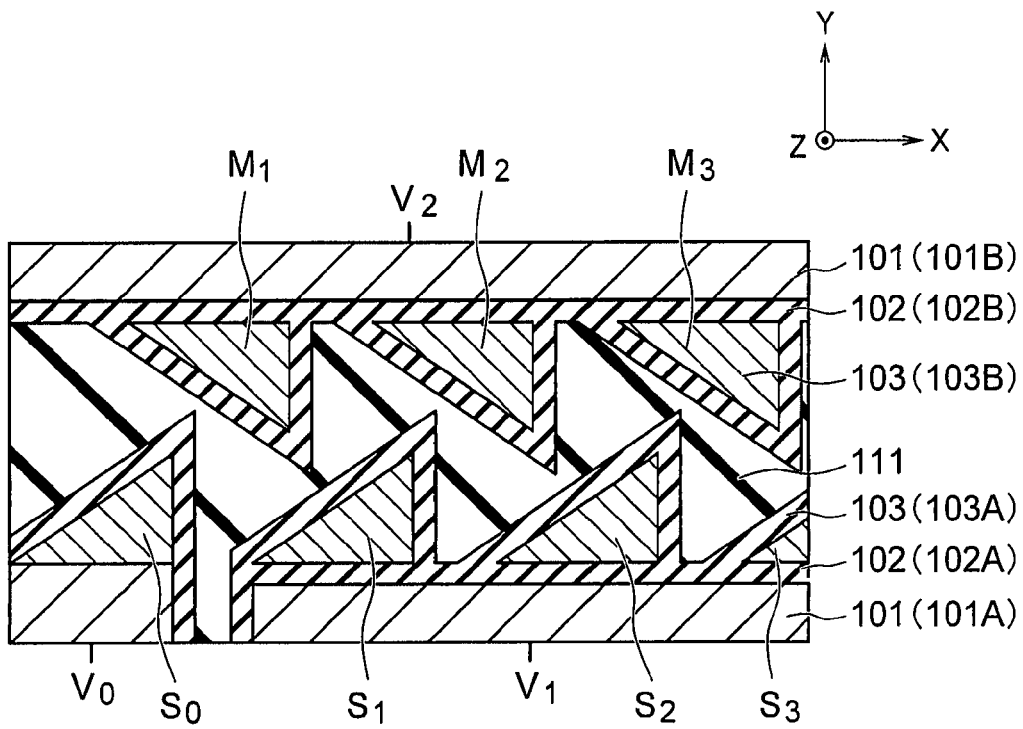

FIG. 4 is a plan view illustrating a second example of the memory layer in the first stage of the shift register of the first embodiment.

This example differs from the first example in that the control electrode 101A for the memory layer $S_0$ is electrically connected to the memory layer $S_0$.

In this example, the voltage $V_0$ when electrons are injected into the memory layer $S_0$ can be set to an arbitrary value in the range in which no electron is emitted to the buffer layer $B_1$.

In this example, when the memory layer $S_0$ is used for transmitting electrons, similarly to the other memory layers, the absolute value of the voltage $V_0$ is set to be smaller than that of the voltage $V_1$ ($|V_0|<|V_1|$). The reason is the same as that in the first example. It is preferable that the voltages $V_0$ and $V_1$ be set such that the voltage applied to the memory layer $S_0$ is equal to the voltage applied to the other memory layers.

The first and second examples of the memory layer $S_0$ in the first stage have been described above. The existing technique may be used as a third structure of a unit for writing data to the memory layer $S_0$. Hereinafter, an example of the structure of a unit for writing data to the memory layer $S_0$ will be described with reference to FIG. 5.

Figure 5:
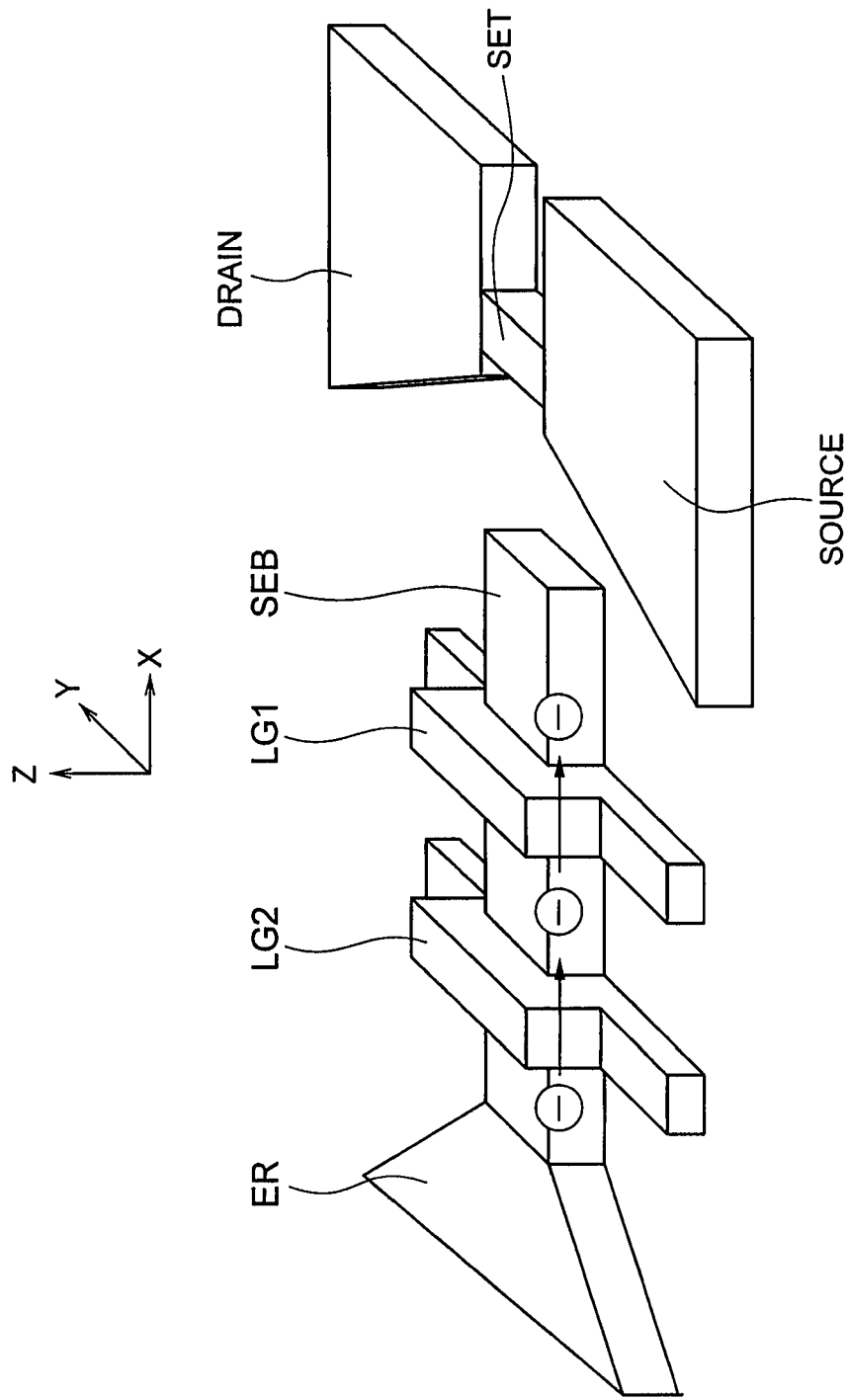
FIG. 5 is a perspective view illustrating an example of a structure of a unit for writing data to the memory layer in the first stage of the shift register of the first embodiment.

FIG. 5 is a perspective view illustrating an example of the structure of the unit for writing data to the memory layer $S_0$ in the first stage of the shift register of the first embodiment.

In FIG. 5, electrons in ER can be written to the memory layer $S_0$ (not illustrated) connected to SEB through LG1 and LG2.

A reading unit for reading data from the memory layer (or the buffer layer) in the last stage in the shift register can also be implemented by the existing technique. The reading unit can detect the electrons stored in the memory layer in the last stage by providing, for example, a single-electron transistor (SET) illustrated in FIG. 5 in the vicinity of the memory layer in the last stage.

(3) Method of Manufacturing Shift Register Memory

Next, a method of manufacturing the shift register memory will be described with reference to FIGS. 6A to 13C.

In order to achieve the above-mentioned memory structure, it is necessary to alternately form the floating electrodes 103 which face each other with a gap of several nanometers and have sharp end portions, such as the angular portions β. When the stability of the operation of the memory is considered, it is preferable to accurately set the distance between the control electrodes 101 or the distance between the floating electrodes 103. However, a large variation occurs in the distances in a patterning process using the lithography technique according to the related art.

FIGS. 6A to 13C are diagrams illustrating the method of manufacturing the shift register memory of the first embodiment.

Figure 6A:
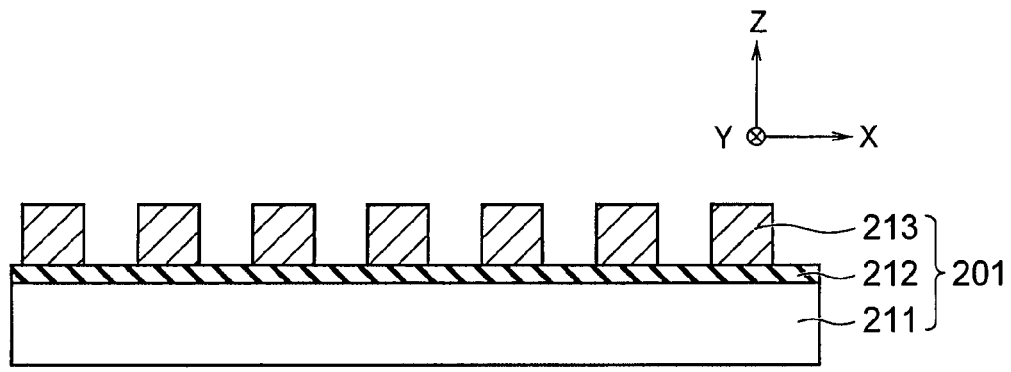
FIGS. 6A to 13C are diagrams illustrating a method of manufacturing the shift register memory of the first embodiment.
Figure 6B:
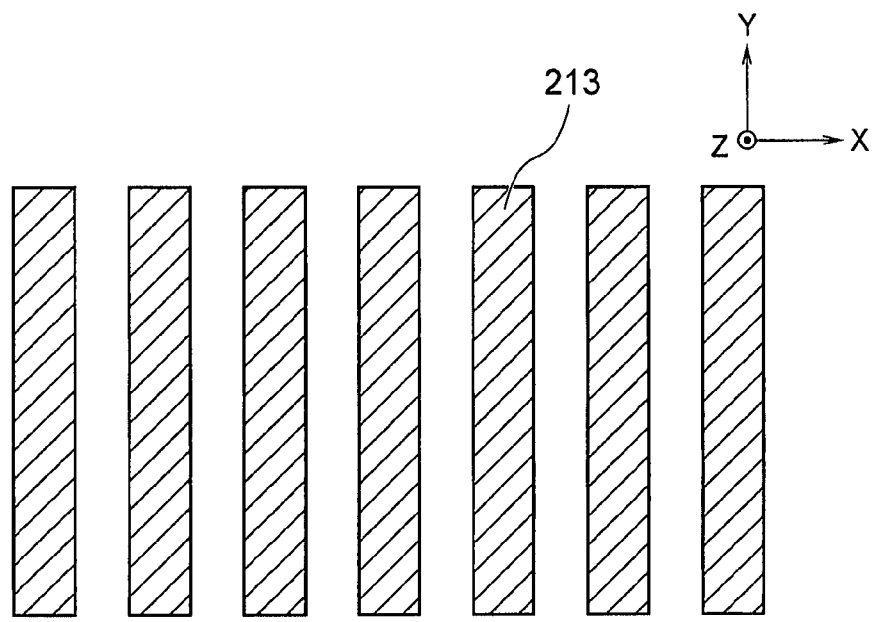
Figure 6C:
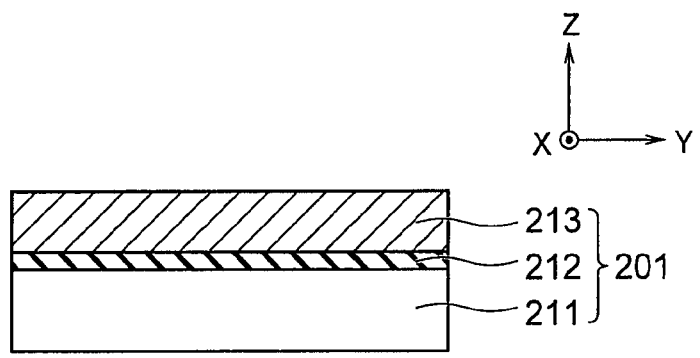
Figure 7A:
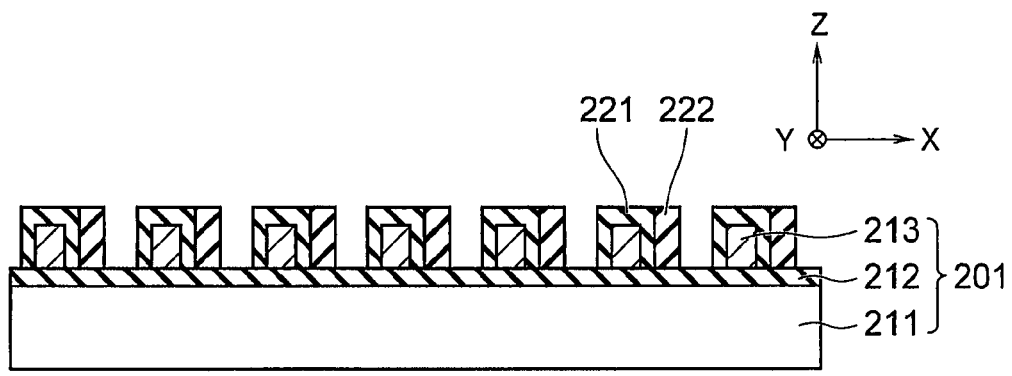
Figure 7B:
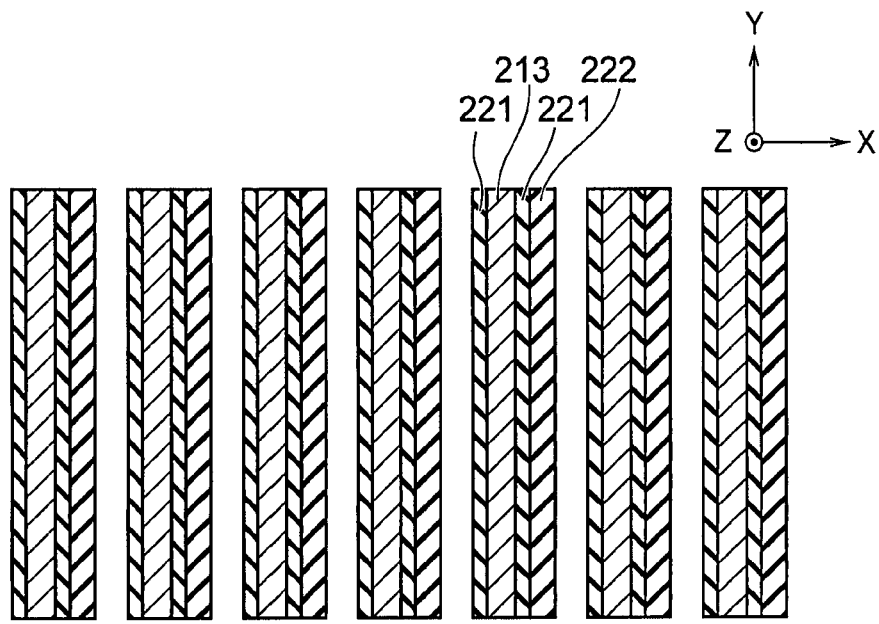
Figure 7C:
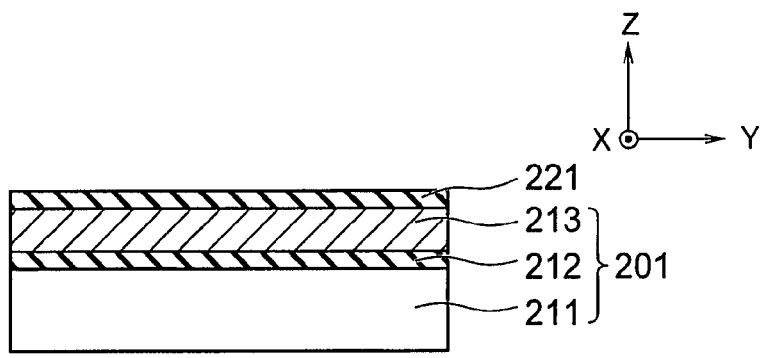

FIGS. 6A, 7A, ... and 13A are cross-sectional views illustrating the cross sections perpendicular to the Y direction. FIGS. 6B, 7B, ... and 13B are cross-sectional views illustrating the cross sections perpendicular to the Z direction. FIGS. 6C, 7C, ... and 13C are cross-sectional views illustrating the cross sections perpendicular to the X direction. Note that FIGS. 6B, 7B, ... and 13B are the cross-sectional views illustrating layers 213 (which will be described in detail below) taken along the plane perpendicular to the Z direction.

In the method of this embodiment, first, a semiconductor-on-insulator (SOI) substrate 201 is prepared (FIGS. 6A to 6C). The SOI substrate 201 includes a semiconductor substrate 211, a buried insulator 212 which is formed on the semiconductor substrate 211, and a semiconductor layer 213. The semiconductor substrate 211, the buried insulator 212, and the semiconductor layer 213 are, for example, a silicon substrate, a silicon oxide film, and a silicon layer, respectively.

Next, as illustrated in FIGS. 6A to 6C, the semiconductor layer 213 is processed into a line-and-space (L/S) pattern. In this embodiment, the semiconductor layer 213 is processed by a so-called sidewall transfer process. As a result, the semiconductor layer 213 is processed into an L/S pattern with dimensions equal to or less than a lithography limit. As illustrated in FIGS. 6A to 6C, the semiconductor layer 213 is processed into a plurality of semiconductor layers (line patterns) 213 which are adjacent to each other in the X direction and extend in the Y direction.

Next, as illustrated in FIGS. 7A to 7C, a silicon oxide film ($SiO_2$ film) 221 is formed as the first insulator on the surface of each semiconductor layer 213 by thermal oxidation. Next, as illustrated in FIGS. 7A to 7C, a silicon nitride film (SiN film) 222 is formed as the second insulator on one side surface of each semiconductor layer 213 by glancing angle sputtering. In FIGS. 7A to 7C, the silicon nitride film 222 is formed on the side surface of each semiconductor layer 213 which faces the +X direction via the silicon oxide film 221.

In this embodiment, after the silicon nitride film 222 is formed on both side surfaces of the semiconductor layer 213, the silicon nitride film 222 on one side surface is etched by glancing angle ion irradiation. In this way, the structure illustrated in FIGS. 7A to 7C may be achieved.

Figure 8A:
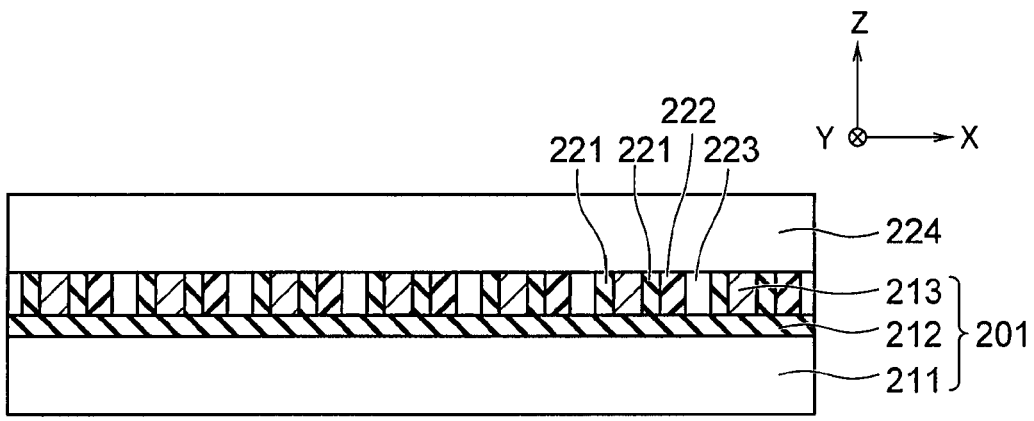
Figure 8B:
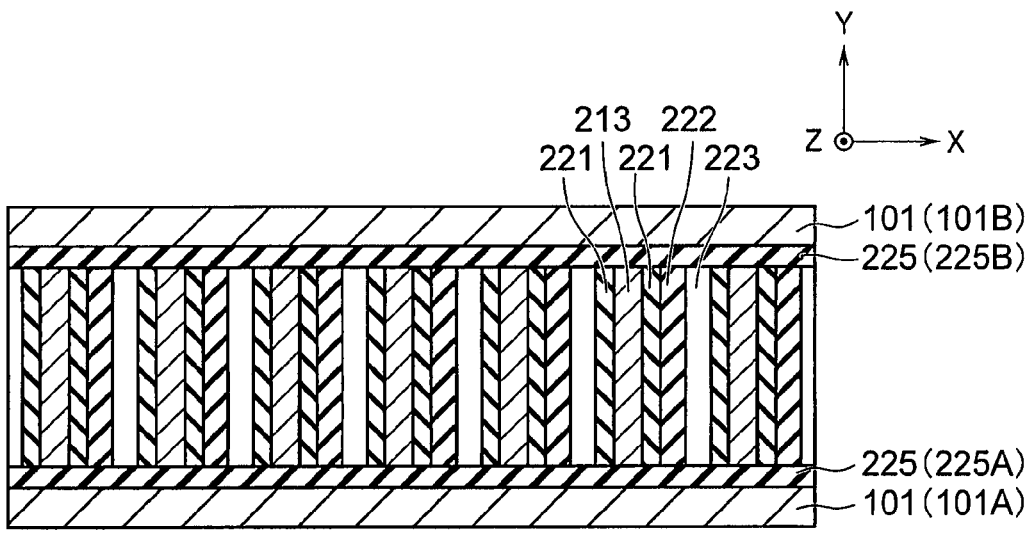
Figure 8C:
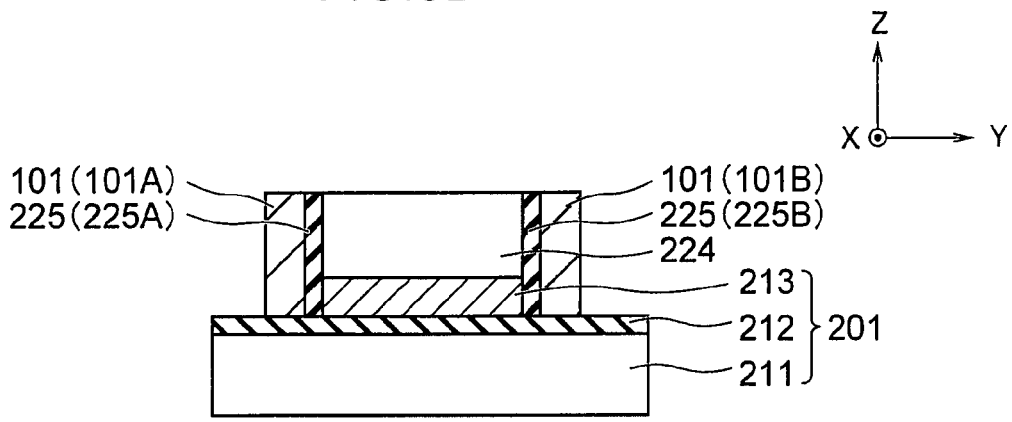

Next, as illustrated in FIGS. 8A to 8C, a sacrificial film 223 is buried between the semiconductor layers 213. The sacrificial film 223 is, for example, a silicon oxide film. The sacrificial film 223 is buried by forming a silicon oxide film on the entire surface of the SOI substrate 201 and planarizing the silicon oxide film using chemical mechanical polishing (CMP). Next, as illustrated in FIGS. 8A to 8C, a cap film 224 is formed on the entire surface of the SOI substrate 201. The cap film 224 is, for example, a SiGe (silicon germanium) film.

Next, as illustrated in FIGS. 8A to 8C, a layer including the semiconductor layer 213, the oxide film 221, the nitride film 222, the sacrificial film 223, and the cap film 224 is processed into a strip-shaped structure which extends in the X direction.

Next, as illustrated in FIGS. 8A to 8C, sidewall nitride films (SiN films) 225 are formed on both side surfaces of the above structure in the Y direction by low pressure chemical vapor deposition (LPCVD) and reactive ion etching (RIE). The thickness of the sidewall nitride films 225 determines the distance between the control electrode 101 and the floating electrode 103. The sidewall nitride films 225 (225A and 225B) are an example of the first and second sidewall insulators.

Next, as illustrated in FIGS. 8A to 8C, the control electrodes 101 are formed on both side surfaces of the above structure in the Y direction via the sidewall nitride films 225. The control electrodes 101 are formed by depositing an electrode material on the entire surface of the SOI substrate 201, and removing the electrode material other than that on both side surfaces of the above structure.

Figure 9A:
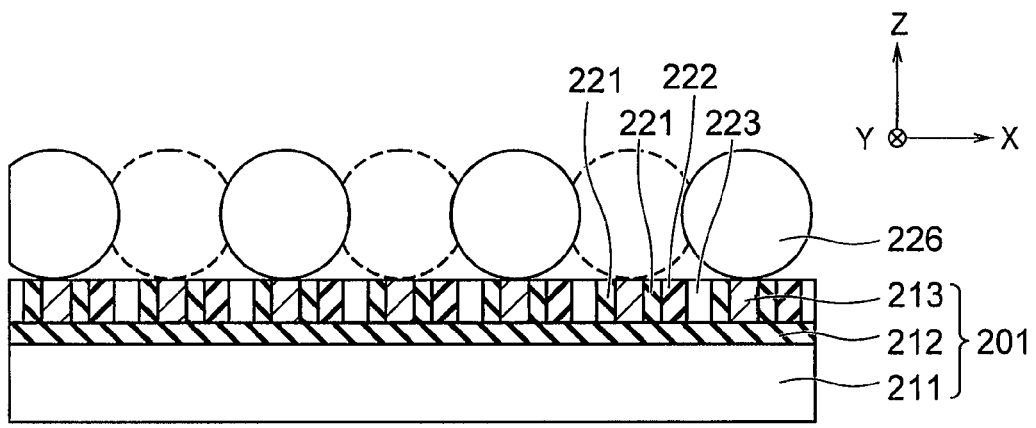
Figure 9B:
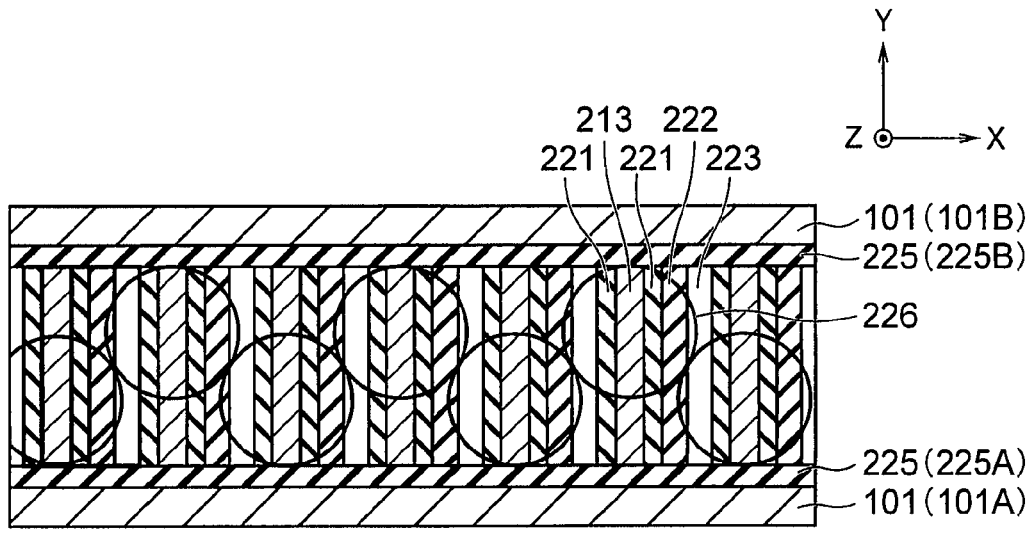
Figure 9C:
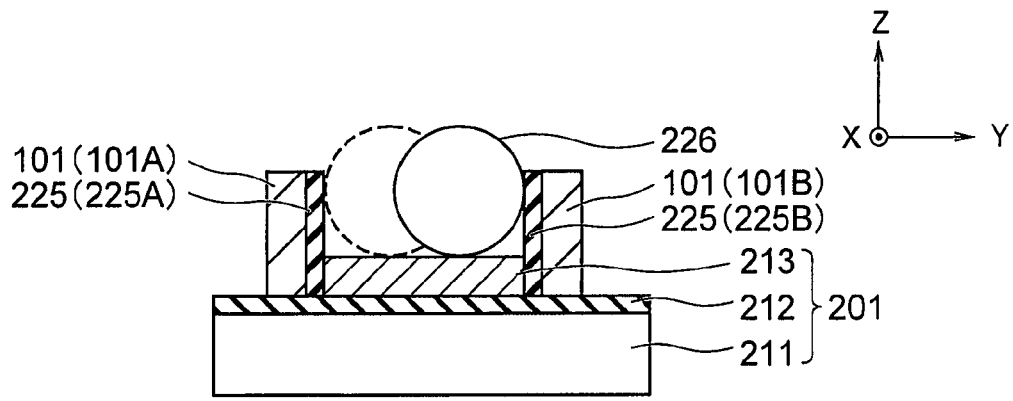

Next, as illustrated in FIGS. 9A to 9C, the cap film 224 is removed. As a result, trenches are formed between the sidewall nitride films 225, and the upper surfaces of the semiconductor layer 213, the oxide films 221, the nitride films 222, and the sacrificial films 223 are exposed through the trenches.

Next, as illustrated in FIGS. 9A to 9C, a diblock copolymer is formed in the trenches and a heat treatment is performed to self-organize the diblock copolymer. FIGS. 9A to 9C illustrate a plurality of self-organized films 226 which are minutely filled in the trenches by self-organization. In this embodiment, the self-organized films 226 have spherical shapes. However, the self-organized films 226 may have cylindrical shapes having the Z direction as the axial direction.

In this embodiment, the width of the trench is set to be smaller than the pitch between the self-organized films 226 in the X direction and the pitch between the self-organized films 226 which are arranged in zigzag is set to be substantially equal to the pitch between the semiconductor layers 213 in the X direction. The pitches can be set by adjusting the radius of the self-organized films 226, the distance between the sidewall nitride films 225, and the pitch between the semiconductor layers 213 in the X direction.

Figure 10A:
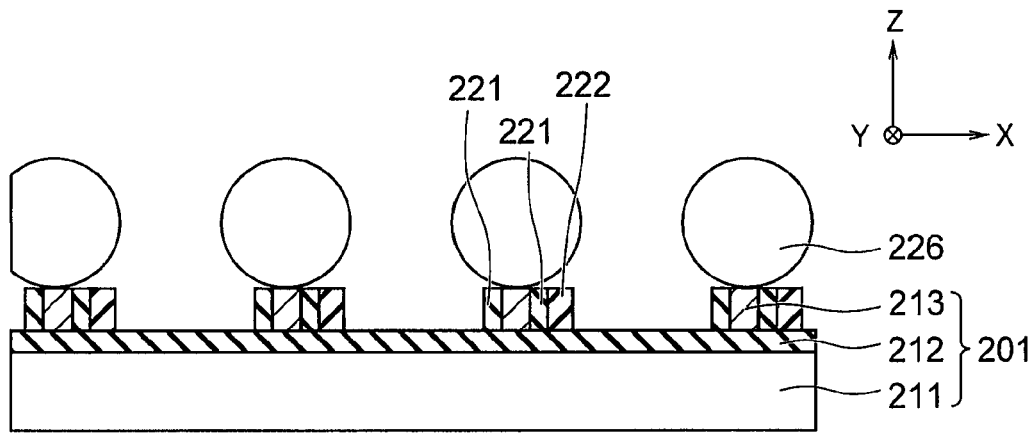
Figure 10B:
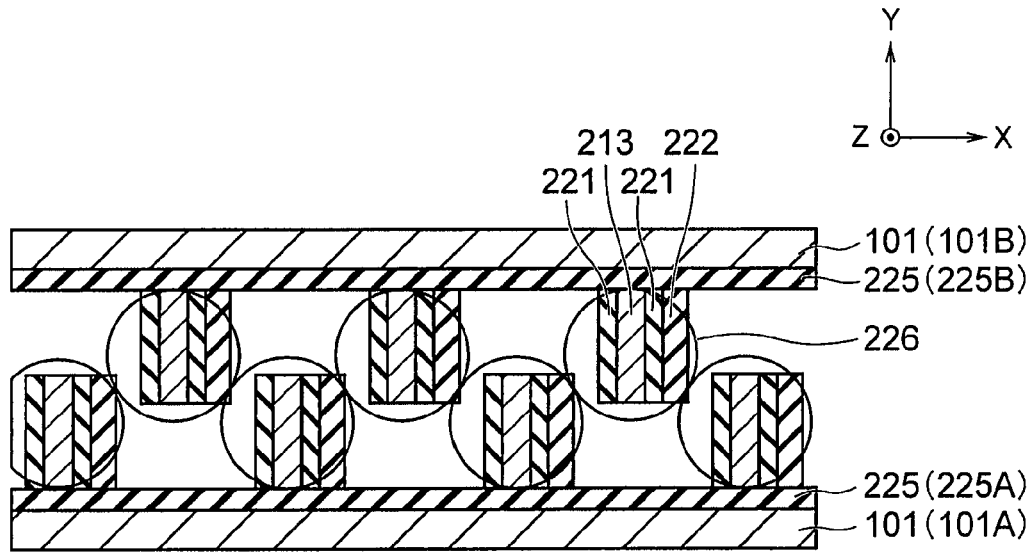
Figure 10C:
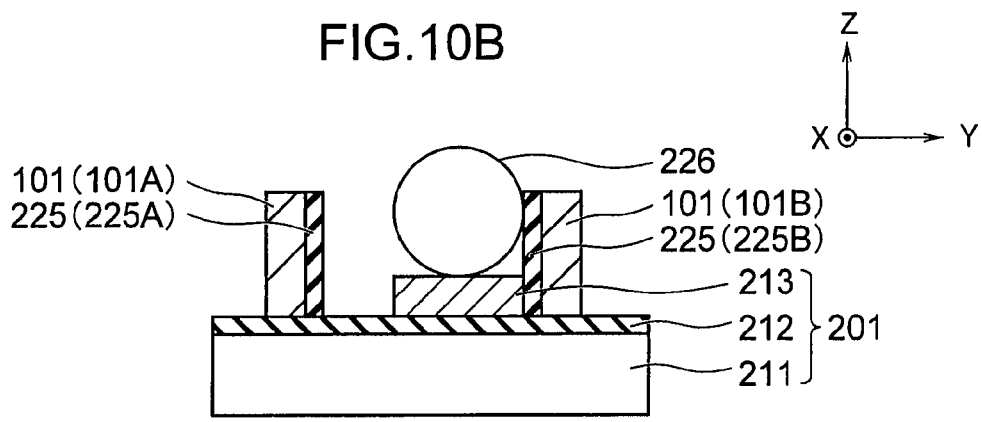

Next, as illustrated in FIGS. 10A to 10C, the semiconductor layer 213, the oxide films 221, and the nitride films 222 are etched using the self-organized films 226 as a mask. As a result, a plurality of line patterns including the semiconductor layer 213, the oxide films 221, and the nitride films 222 remain alternately in the trenches. Then, the sacrificial films 223 and the self-organized films 226 are removed.

Figure 11A:
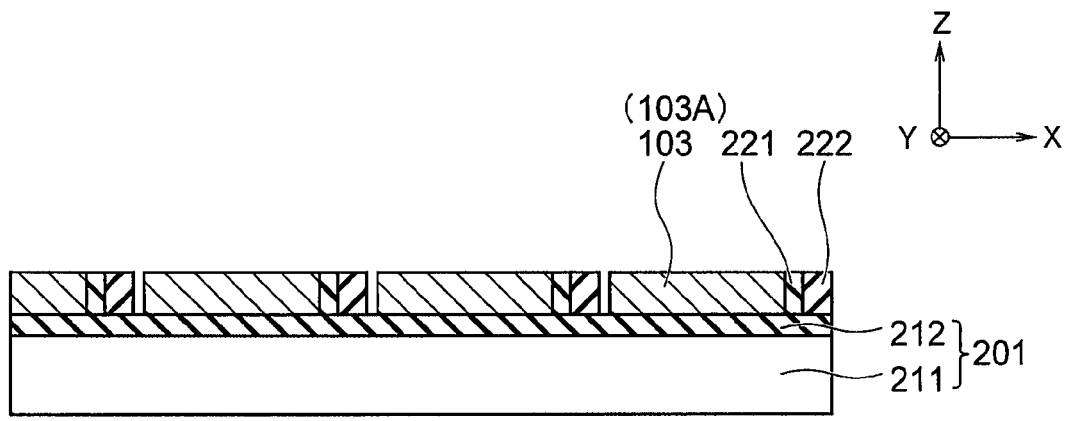
Figure 11B:
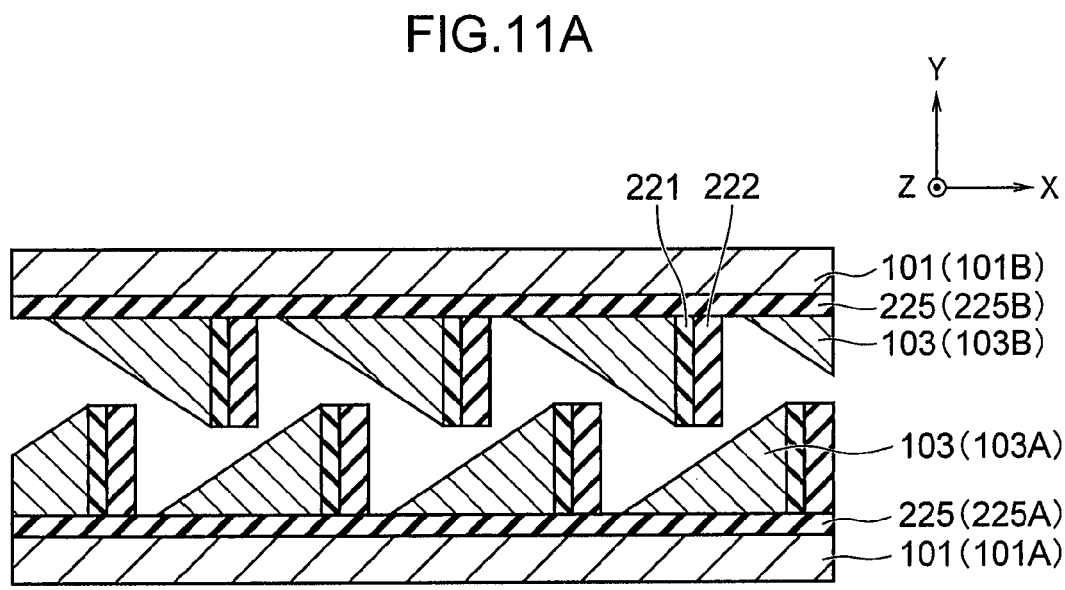
Figure 11C:
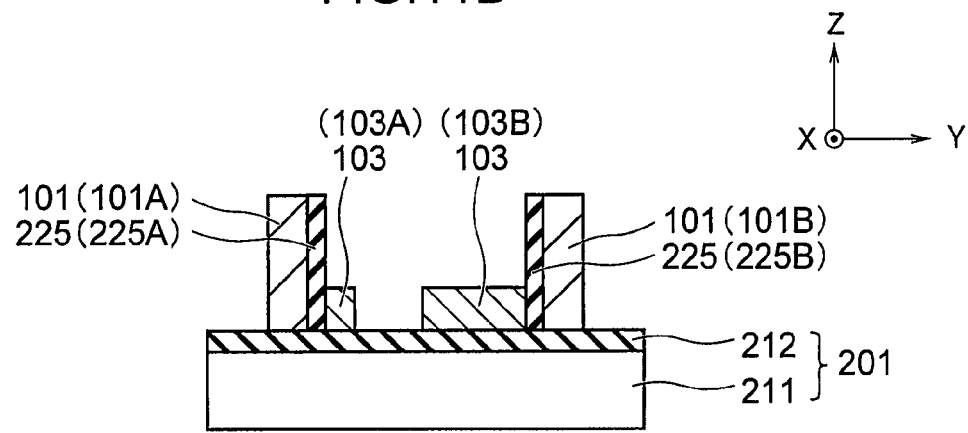

Next, the oxide film 221 facing the −X direction in each line pattern is removed by a rare hydrofluoric acid treatment and the side surface of each semiconductor layer 213 which faces the −X direction is exposed (FIGS. 11A to 11C). At that time, since the oxide film 221 facing the +X direction in each line pattern is protected by the nitride film 222, it is not removed by the rare hydrofluoric add treatment.

Next, an epitaxial semiconductor layer is grown on the side surface of each line pattern which faces the −X direction along the crystal plane orientation of the semiconductor layer 213 (FIGS. 11A to 11C). The epitaxial semiconductor layers are the floating electrodes 103. The epitaxial semiconductor layers above the first and second control electrodes 101A and 101B are the first and second floating electrodes 103A and 103B, respectively. The floating electrodes 103 are, for example, silicon layers.

Figure 15:
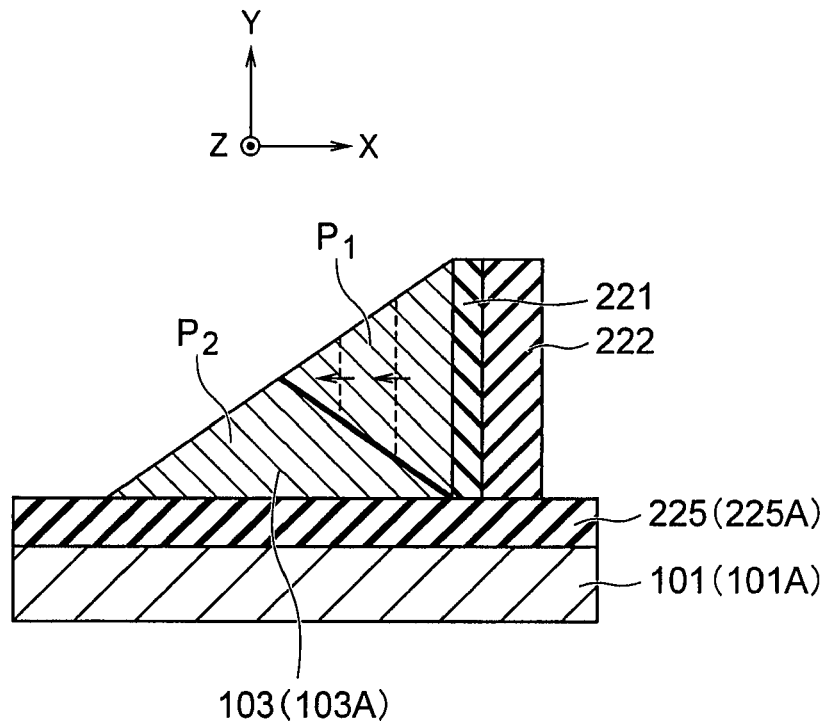
FIG. 15 is a plan view illustrating a growth mechanism of a floating electrode.

Next, the growth mechanism of the floating electrode 103 will be described with reference to FIG. 15. FIG. 15 is a plan view illustrating the growth mechanism of the floating electrode 103.

$P_1$ indicates a growth process of the floating electrode 103 when the sidewall nitride film 225 is absent. When the sidewall nitride film 225 is absent, the epitaxial growth is substantially stopped at the (111) plane on the side surface of the floating electrode 103. As a result, the floating electrode 103 with the shape $P_1$ is formed.

However, when the sidewall nitride film 225 is present, the epitaxial growth is performed on the side surface of the floating electrode 103 facing the sidewall nitride film 225, regardless of the crystal plane orientation. Therefore, the floating electrode 103 with a shape including $P_1$ and $P_2$ is formed.

When the sidewall insulator 225 is a silicon oxide film instead of the silicon nitride film, the epitaxial growth does not occur. Therefore, in this embodiment, a silicon nitride film is used as the sidewall insulator 225.

Hereinafter, the manufacturing method will be continuously described with reference to FIGS. 6A to 13C.

Figure 12A:
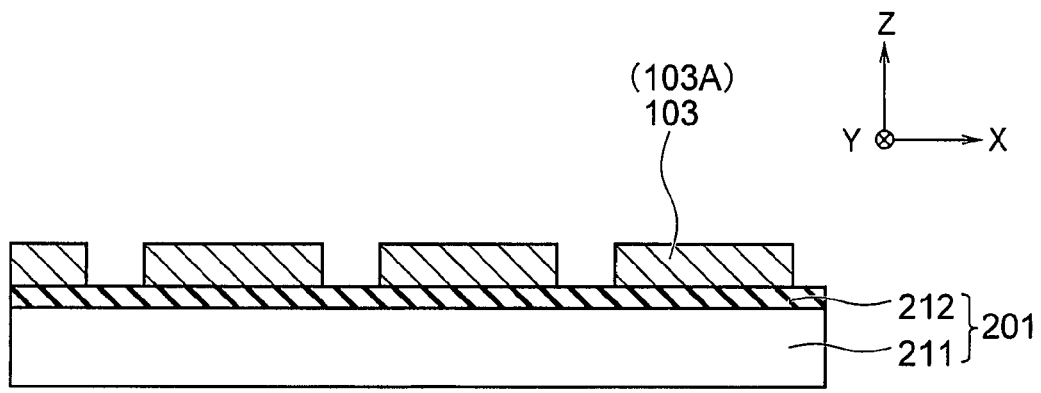
Figure 12B:
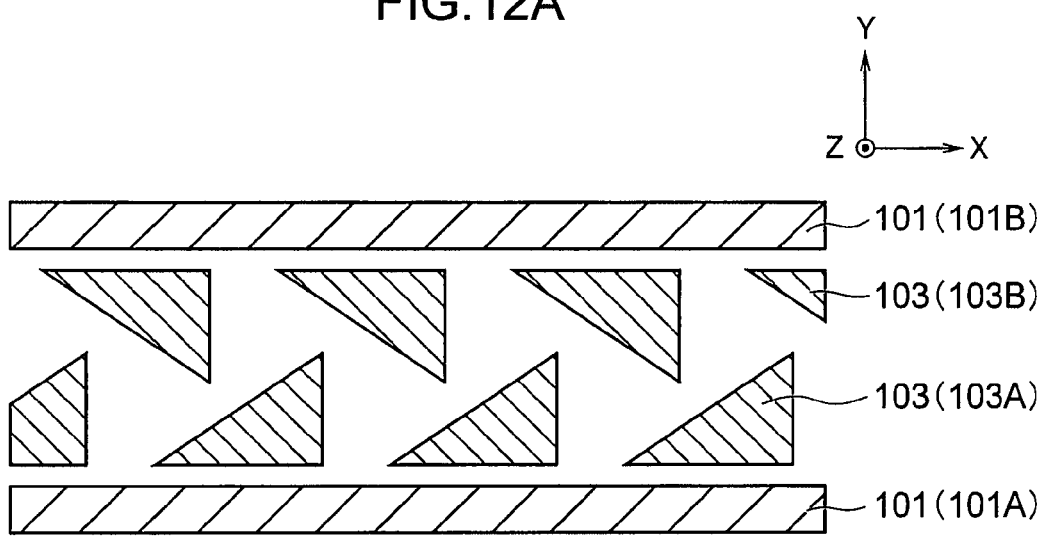
Figure 12C:
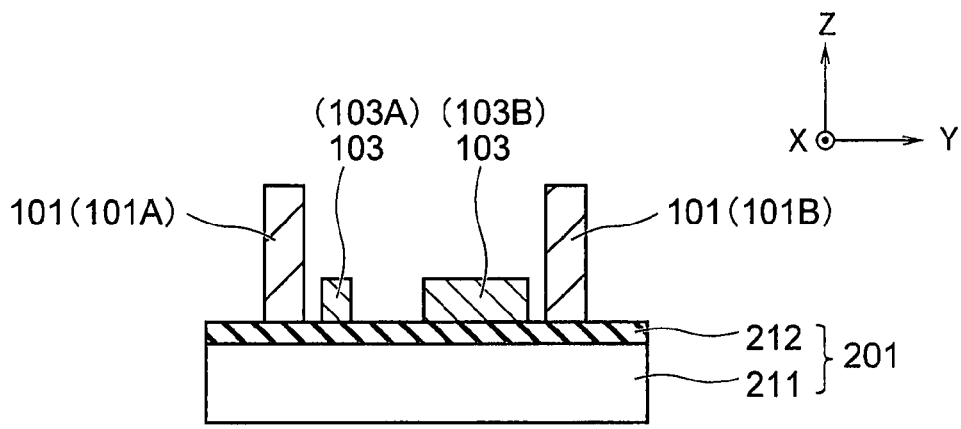

Next, as illustrated in FIGS. 12A to 12C, the oxide films 221, the nitride films 222, and the sidewall nitride films 225 are removed from the SOI substrate 201.

Figure 13A:
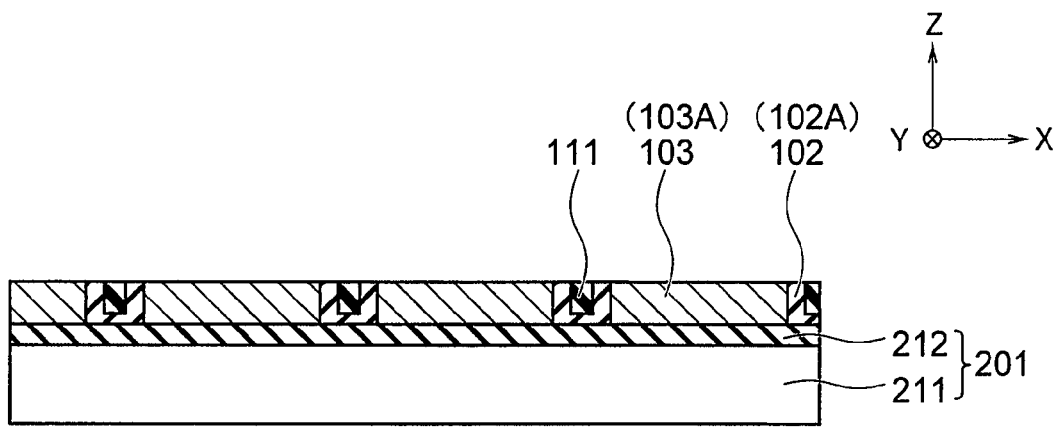
Figure 13B:
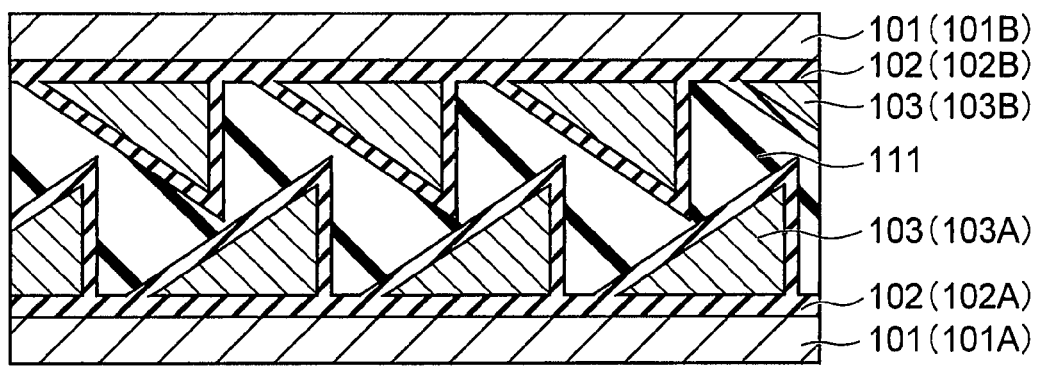
Figure 13C:
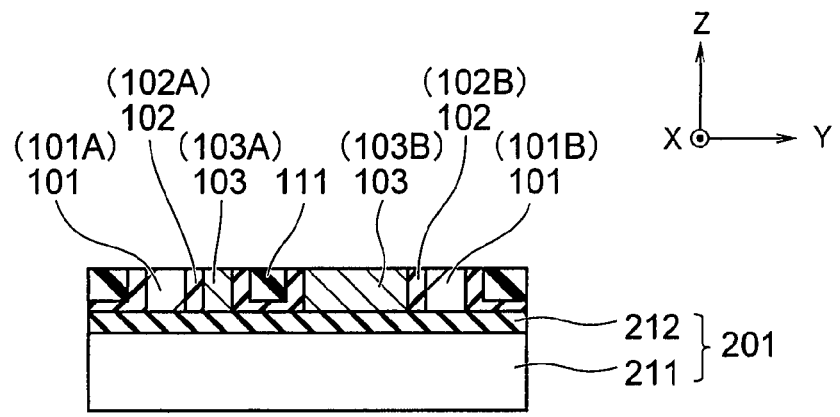

Next, as illustrated in FIGS. 13A to 13C, the insulators 102 and the insulator 111 are sequentially formed on the SOI substrate 201. The insulators 102 in this embodiment have a permittivity higher than that of a silicon oxide film (for example, silicon nitride films or high-k insulators), and are formed so as to fill the gaps between the control electrodes 101 and the floating electrodes 103. The insulator 111 in this embodiment is a silicon oxide film, and is formed so as to fill the gap between the control electrodes 101.

In this way, the shift register memory is manufactured. According to this method, it is possible to alternately form the floating electrodes 103 each having a sharp end portion, such as the angular portion β. As a result, it is possible to manufacture the shift register having the structure illustrated in FIG. 1. In addition, according to this method, it is possible to form the floating electrodes 103 with dimensions equal to or less than the processing accuracy of the lithography technique with high accuracy.

In this embodiment, the shift register having the structure illustrated in FIG. 1 is used and the shift register is manufactured by, for example, the method illustrated in FIGS. 6A to 13C. Therefore, it is possible to reduce the dimensions of the floating electrodes 103 or the distance between the floating electrodes 103 and improve the processing accuracy of the floating electrodes 103. In this way, in this embodiment, it is possible to achieve a shift register with high capacity and reliability.

In addition, the method illustrated in FIGS. 6A to 13C can manufacture the shift register with a relatively small number of processes. For example, an etching process using the self-organized film 226 as a mask and a process of epitaxially growing the floating electrodes 103 make it possible to simply manufacture a floating electrode 103 having a sharp end portion, such as the angular portion 13, with a small number of processes. In addition, a sidewall transfer process makes it possible to simply manufacture the floating electrodes 103 with dimensions equal to or less than the processing accuracy of the lithography technique with a small number of processes.

Figure 14A:
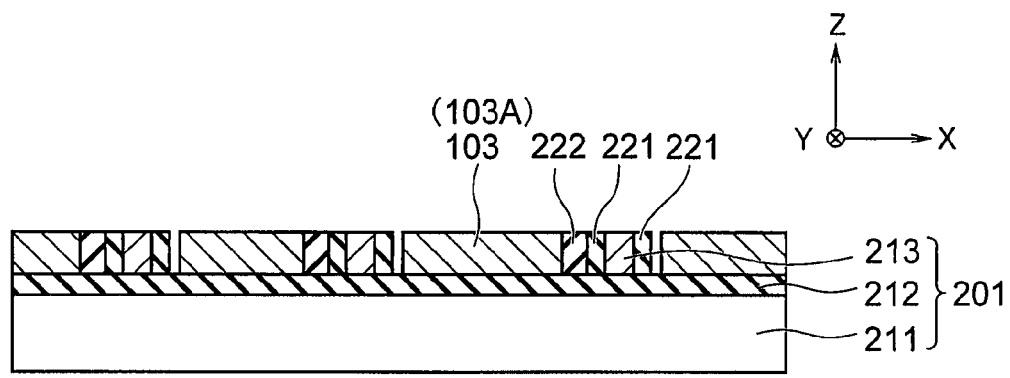
FIGS. 14A to 14C are diagrams illustrating a modification of the method of manufacturing the shift register memory of the first embodiment.
Figure 14B:
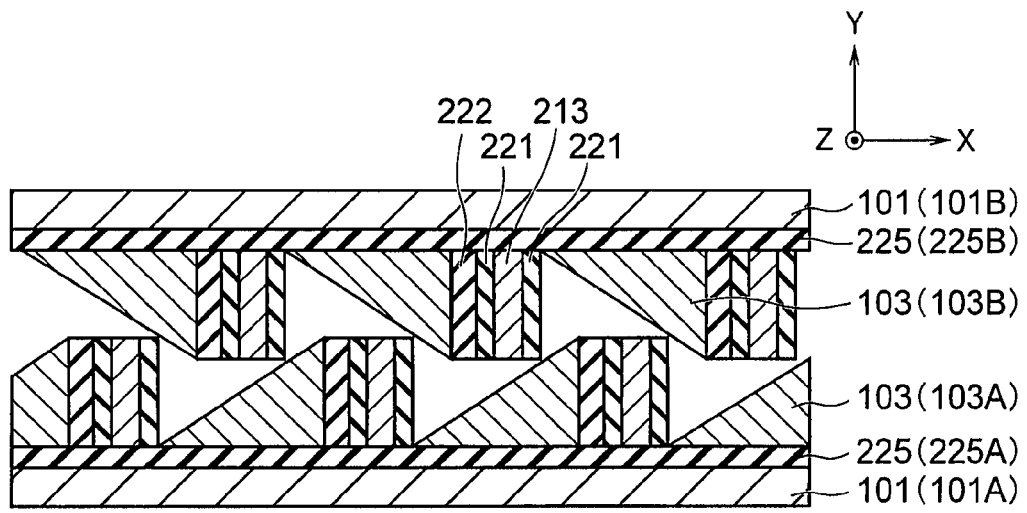
Figure 14C:
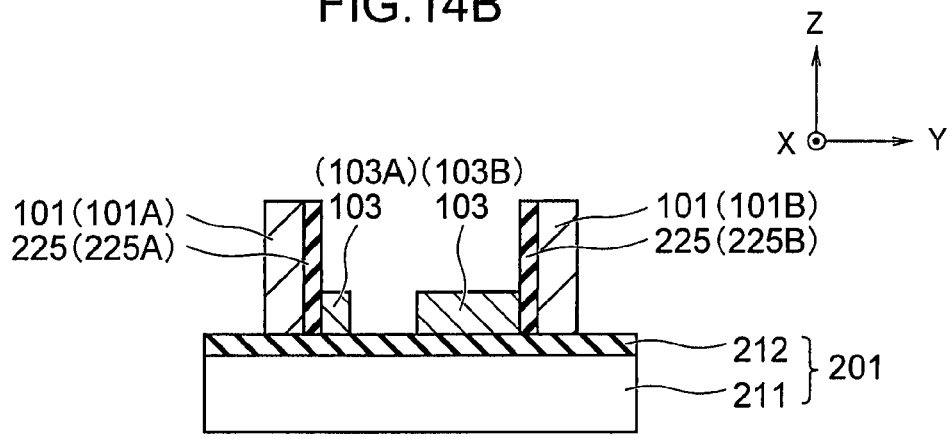

In the method illustrated in FIGS. 6A to 13C, the floating electrodes 103 are grown using the semiconductor layers 213 and the sidewall nitride films 225. However, as illustrated in FIGS. 14A to 14C, the floating electrodes 103 may be grown using the nitride films 222 and the sidewall nitride films 225. FIGS. 14A to 14C are diagrams illustrating a modification of the method of manufacturing the shift register memory of the first embodiment. When the method according to the modification is used, a silicon nitride film 222 is formed on the side surface of each semiconductor layer 213 which faces the −X direction in FIGS. 7A to 7C, and oxide films 221 of each line pattern is not removed in FIGS. 11A to 11C.

(4) Effect of First Embodiment

Finally, the effect of the first embodiment will be described.

As described above, in the shift register memory of this embodiment, a plurality of first and second floating electrodes 103A and 103B are arranged between a pair of control electrodes 101 so as to face the first and second control electrodes 101A and 101B, respectively (FIG. 1). Each floating electrode 103 is formed in a planar shape which is mirror-asymmetric with respect to the plane perpendicular to the X direction (FIG. 1). Therefore, it is possible to achieve a shift register which performs a shift operation according to the operating principle illustrated in FIGS. 2A to 2D.

In this embodiment, the shift register having the structure illustrated in FIG. 1 is used and the shift register is manufactured by, for example, the method illustrated in FIGS. 6A to 13C. Therefore, it is possible to reduce the dimensions of the floating electrodes 103 or the distance between the floating electrodes 103, and improve the processing accuracy of the floating electrodes 103. Therefore, in this embodiment, it is possible to achieve a shift register with high capacity and reliability. According to the method illustrated in FIGS. 6A to 13C, it is possible to manufacture the shift register with a small number of processes.

As described above, this embodiment can provide a shift register memory with high capacity and reliability and a method of manufacturing the shift register memory with a small number of processes.

In this embodiment, the floating electrodes 103 are silicon layers. However, the floating electrodes 103 may be other semiconductor layers. An example of the semiconductor layers is germanium layers. In this case, the semiconductor layer 213 of the SOI substrate 201 is a germanium layer, not a silicon layer.

Figure 16:
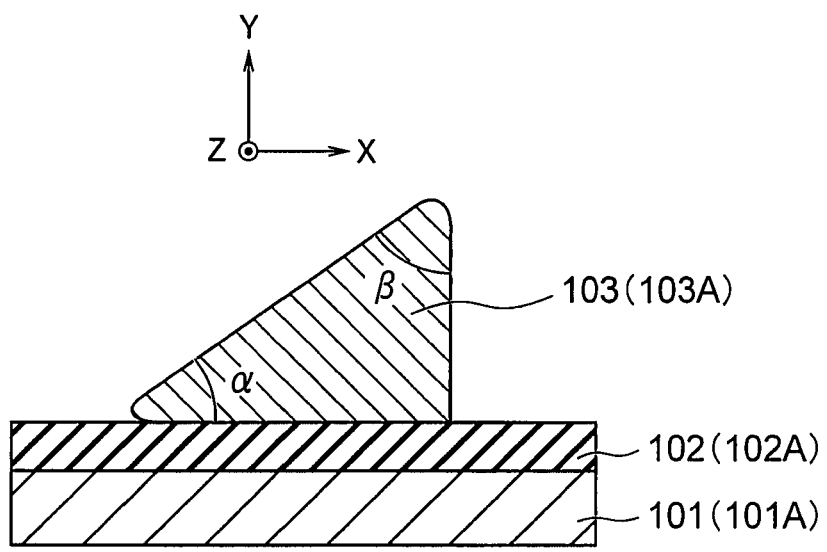
FIG. 16 is a plan view illustrating shapes of angular portions of the floating electrode.

In addition, the angular portion α or the angular portion β of each floating electrode 103 may be rounded, as illustrated In FIG. 16. FIG. 16 is a plan view illustrating the shapes of the angular portions α and β of a floating electrode 103. In FIG. 16, the curvature radius of the angular portion α may be equal to or different from the curvature radius of the angular portion β.

The remaining angular portion (right-angled portion) of the floating electrode 103 may be rounded. In addition, the angle of the angular portion may not be 90 degrees.

Hereinafter, second and third embodiments, which are modifications of the first embodiment, will be described. In the second and third embodiments, the difference from the first embodiment will be mainly described.

Second Embodiment

Figure 17A:
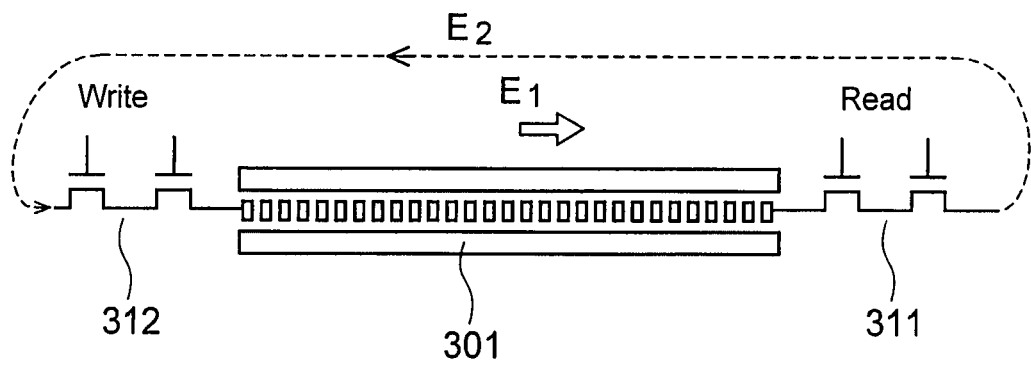
FIGS. 17A and 17B are diagrams schematically illustrating a structure of a shift register memory of a second embodiment.
Figure 17B:
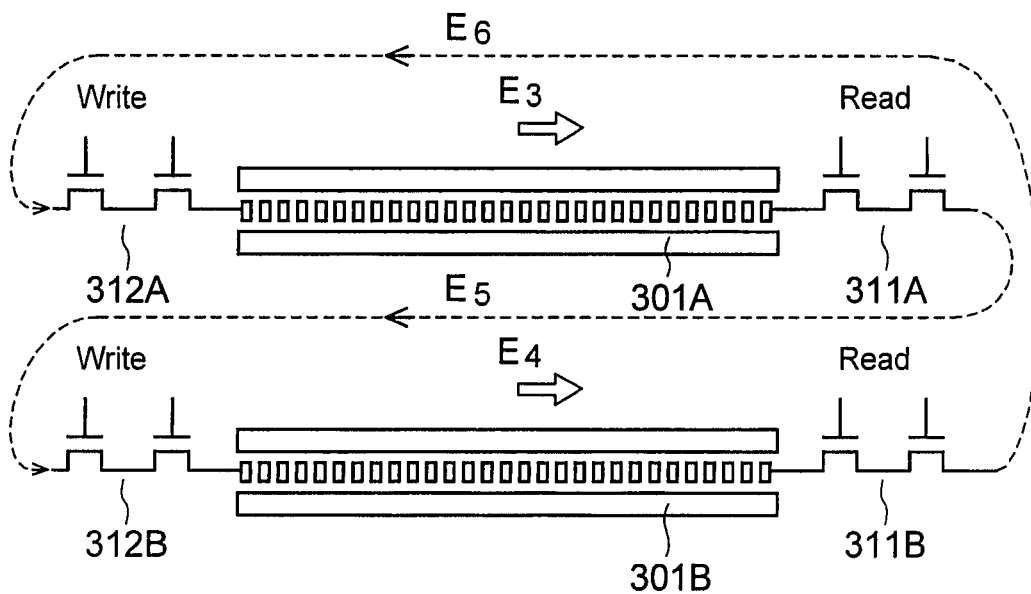

FIGS. 17A and 17B are diagrams schematically illustrating the structure of a shift register memory of the second embodiment.

FIG. 17A abstractly illustrates a shift register 301 with the structure illustrated in FIG. 1.

A writing device 312 is connected to a floating electrode 103 (floating electrode 103 in the first stage) which is disposed at one end of the shift register 301 and a reading device 311 is connected to a floating electrode 103 (floating electrode 103 in the last stage) which is disposed at the other end of the shift register 301. The former floating electrode 103 is an example of a first end floating electrode, and the latter floating electrode 103 is an example of a second end floating electrode.

The shift register 301 can shift data only in one direction (+X direction), as represented by an arrow $E_1$, but cannot shift data in the reverse direction. Therefore, in the memory illustrated in FIG. 17A, the writing device 312 writes data to the shift register 301. Then, when data is read, charges in each floating electrode 103 is shifted to the reading device 311 and the reading device 311 reads data.

Therefore, in order to read necessary data (hereinafter, referred to as "data D"), it is necessary to read all data on the downstream side of the data D, store the read data in a buffer memory once, and read the data D. Then, after the data D is read, data on the downstream side of the data D needs to be written back to the shift register 301. Therefore, a high-capacity buffer memory needs to be provided in a peripheral circuit unit of the memory.

Therefore, this embodiment uses any of the following first to third measures.

(1) First Measure

In the first measure, as illustrated in FIG. 17A, the reading device 311 and the writing device 312 are connected to each other by an interconnect. Then, when data on the downstream side of the data D is read, the read data is immediately transferred to the writing device 312 by the interconnect, as represented by an arrow $E_2$, and is then written back to the shift register 301. In this way, it is possible to minimize the size of the buffer memory.

In the first measure, processes are performed in the order of shift, reading, writing-back, shift, reading, writing-back, . . . . In principle, data shift is performed on the writing side and the reading side at the same time. Therefore, in order to store all of the read data in a non-volatile manner, the buffer memory needs to be a non-volatile memory or data in the buffer memory needs to be moved to the non-volatile memory when power is turned off.

(2) Second Measure

In the second measure, as illustrated in FIG. 17B, a pair of two shift registers 301A and 301B is used. In FIG. 17B, a reading device and a writing device of the shift register 301A are respectively represented by 311A and 312A and a reading device and a writing device of the shift register 301B are respectively represented by 311B and 312B.

In FIG. 17B, the reading device 311A and the writing device 312B are connected to each other by an interconnect. In addition, the reading device 311B and the writing device 312A are connected to each other by an interconnect. As a result, in FIG. 17B, the shift register 301A and the shift register 301B are connected in an annular shape.

In the second measure, the shift register 301A is used for a memory and the shift register 301B is used for a buffer. Therefore, in the second measure, the buffer memory used in the first measure is not needed. In addition, the operation of the shift registers 301A and 301B is the same as a refresh operation for each half cycle. Therefore, it is possible to access data at a high speed and with high reliability.

The shift register 301A has a structure in which the shift register 301B, the interconnect on the upstream side of the shift register 301B, and the interconnect on the downstream side of the shift register 301B replace the interconnect of the shift register 301 illustrated in FIG. 17A. Data read from the shift register 301A can be written back to the shift register 301A through the shift register 301B and the interconnects.

(3) Third Measure

In the third measure, the shift register 301 illustrated in FIG. 17A includes n memory layers and n+1 buffer layers (n is an integer equal to or greater than 2). Therefore, the floating electrode 103 in the first stage and the floating electrode 103 in the last stage are buffer layers.

In the third measure, the buffer layer in the first stage and the buffer layer in the last stage are directly connected to each other by the interconnect without passing through the reading device 311 and the writing device 312. Therefore, in the third measure, it is not necessary to write back data in the last stage to the first stage and the data in the last stage becomes data in the first stage. According to the third measure, it is possible to simply treat the read data. In addition, the non-volatility of data is guaranteed when data is transmitted from the buffer layer in the first stage to the memory layer in the next stage.

In the third measure, the shift registers 301A and 301B illustrated in FIG. 17B may be applied instead of the shift register 301 illustrated in FIG. 17A. In this case, the first stage of the shift register 301A is directly connected to the last stage of the shift register 301B by an interconnect and the first stage of the shift register 301B is directly connected to the last stage of the shift register 301A by an interconnect.

When the third measure is used, the buffer layer in the first stage may have, for example, the same structure as the memory layer $S_0$ in the first stage illustrated in FIG. 3 or FIG. 4.

(4) Effect of Second Embodiment

Finally, the effect of the second embodiment will be described.

As described above, this embodiment has the structure in which one or more shift registers are connected to each other in an annular shape by the interconnects. Therefore, according to this embodiment, it is possible to reduce the number of buffer memories or it is not necessary to use the buffer memory.

When a plurality of shift registers 301 are arranged on one substrate, the shift registers 301 may be arranged in a direction parallel to the surface (principal surface) of the substrate or they may be stacked in a direction perpendicular to the surface of the substrate such that data is transmitted in the direction perpendicular to the surface of the substrate. In addition, the former arrangement and the latter arrangement may be combined with each other. It is possible to increase the capacity of the memory by increasing the number of shift registers 301 stacked. This arrangement may also be applied when the first to third measures are not used.

Third Embodiment

Figure 18:
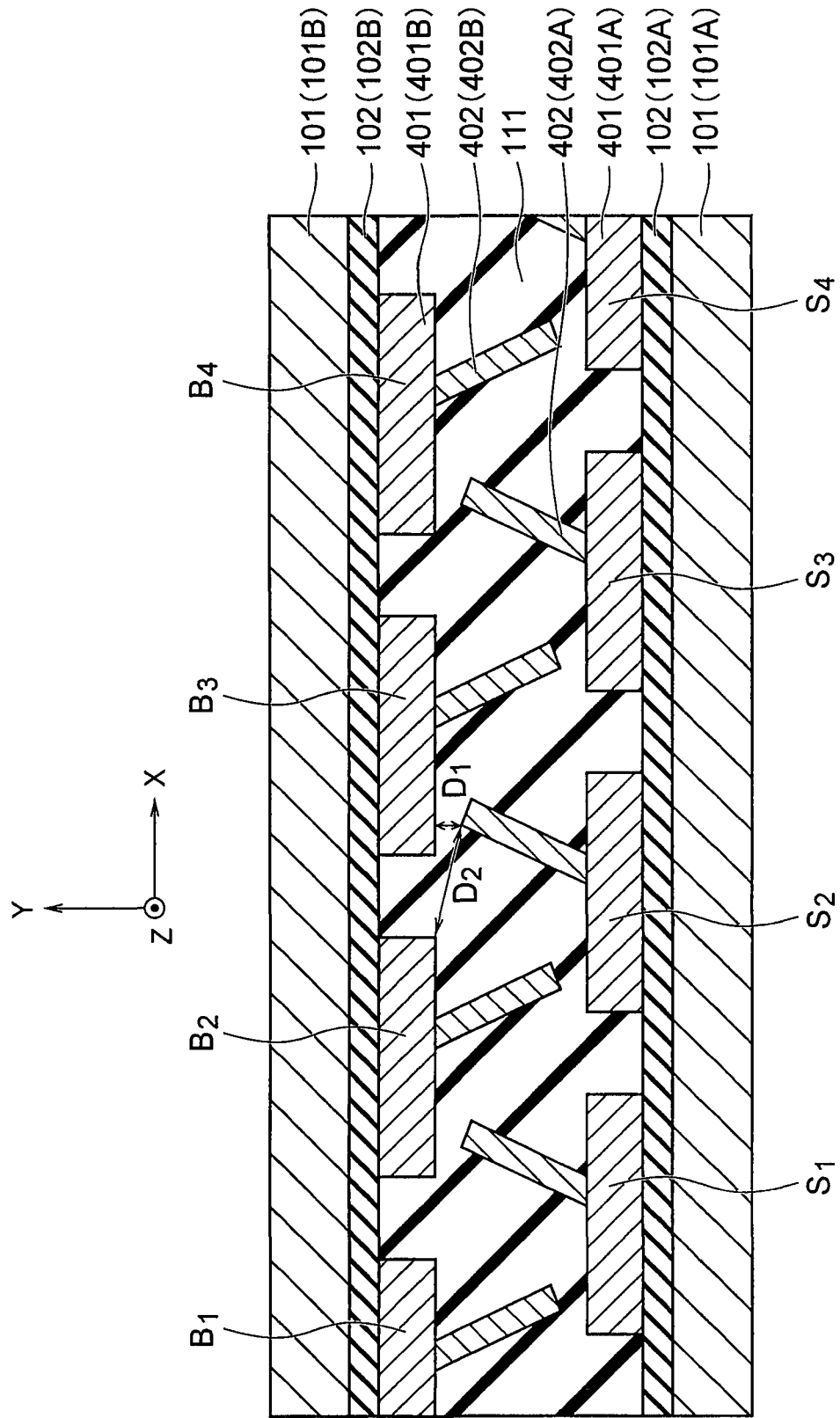
FIG. 18 is a plan view illustrating a structure of a shift register memory of a third embodiment.

FIG. 18 is a plan view illustrating the structure of a shift register memory of the third embodiment.

Each floating electrode 103 of this embodiment has a planar shape which is mirror-asymmetric with respect to the plane perpendicular to the X direction, similarly to the first embodiment.

However, in this embodiment, each floating electrode 103 includes a plate-shaped electrode portion 401 and a linear electrode portion 402. Reference numerals 401A and 402A indicate a plate-shaped electrode portion and a linear electrode portion of a first floating electrode 103A, respectively, and reference numerals 401B and 402B indicate a plate-shaped electrode portion and a linear electrode portion of a second floating electrode 103B.

The plate-shaped electrode portion 401 has a plate shape which expands in the in-plane direction perpendicular to the Y direction. The plate-shaped electrode portion 401 is, for example, a disk-shaped silicon layer. The first plate-shaped electrode portion 401A is arranged so as to come into contact with an insulator 102A, and the second plate-shaped electrode portion 401B is arranged so as to come into contact with an insulator 102B.

The linear electrode portion 402 has a linear shape which extends from the surface of the plate-shaped electrode portion 401. The first linear electrode portion 402A extends from the surface of the first plate-shaped electrode portion 401A to the second control electrode 101B. The second linear electrode portion 402B extends from the surface of the second plate-shaped electrode portion 401B to the first control electrode 101A. The linear electrode portion 402 is, for example, a whisker, a nanowire, or a nanotube.

Next, the positional relation between the floating electrodes 103, for example, a first floating electrode $S_2$ and second floating electrodes $B_2$ and $B_3$ will be described.

In FIG. 18, the distance between the leading end of the linear electrode portion 402A of the floating electrode $S_2$ and the floating electrode $B_3$ is represented by $D_1$ and the distance between the leading end of the linear electrode portion 402A of the floating electrode $S_2$ and the floating electrode $B_2$ is represented by $D_2$.

In this embodiment, the linear electrode portion 402A of each of the first floating electrodes 103A extends toward the plate-shaped electrode portion 401B of the second floating electrode 103B which is adjacent thereto in the +X direction, and the linear electrode portion 402B of each of the second floating electrodes 103B extends toward the plate-shaped electrode portion 401A of the first floating electrode 103A which is adjacent thereto in the +X direction. Therefore, in this embodiment, the distance $D_1$ is set to be shorter than the distance $D_2$ ($D_1 < D_2$). It is preferable that the distance $D_1$ be set to be significantly shorter than the distance $D_2$ ($D_1 \ll D_2$). Similarly to the first embodiment, this structure has the advantage that charges in the floating electrode $S_2$ can be substantially transmitted only to the floating electrode $B_3$ of the floating electrodes $B_2$ and $B_3$.

Effect of Third Embodiment

Finally, the effect of the third embodiment will be described.

As described above, in the shift register memory of this embodiment, a plurality of first and second floating electrodes 103A and 103B are arranged between a pair of control electrodes 101 so as to face the first and second control electrodes 101A and 101B, respectively (FIG. 18). Each floating electrode 103 is formed in a planar shape in which it is mirror-asymmetric with respect to the plane perpendicular to the X direction (FIG. 18). Therefore, similarly to the first embodiment, it is possible to achieve a shift register which performs a shift operation according to the operating principle illustrated in FIGS. 2A to 2D.

In this embodiment, the shift register having the structure illustrated in FIG. 18 is used and the shift register is manufactured by, for example, the method illustrated in FIGS. 6A to 13C. Therefore, it is possible to reduce the dimensions of the floating electrodes 103 or the distance between the floating electrodes 103, and improve the processing accuracy of the floating electrodes 103. Therefore, in this embodiment, similarly to the first embodiment, it is possible to achieve a shift register with high capacity and reliability. According to the above-mentioned method, it is possible to manufacture the shift register with a small number of processes.

As described above, according to this embodiment, it is possible to provide a shift register memory with high capacity and reliability and a method of manufacturing the shift register memory with a small number of processes.

In the second embodiment, the shift register having the structure of the third embodiment may be used instead of the shift register having the structure of the first embodiment.

While certain embodiments have been described, these embodiments have been presented by way of example only, and are not intended to limit the scope of the inventions. Indeed, the novel memories and methods described herein may be embodied in a variety of other forms; furthermore, various omissions, substitutions and changes in the form of the memories and methods described herein may be made without departing from the spirit of the inventions. The accompanying claims and their equivalents are intended to cover such forms or modifications as would fall within the scope and spirit of the inventions.

The invention claimed is:

1. A shift register memory comprising:
   first and second control electrodes extending in a first direction parallel to a surface of a substrate, and facing each other in a second direction perpendicular to the first direction;
   a plurality of first floating electrodes provided in a line on a first control electrode side between the first and second control electrodes; and
   a plurality of second floating electrodes provided in a line on a second control electrode side between the first and second control electrodes;
   wherein each of the first and second floating electrodes has a planar shape which is mirror-asymmetric with respect to a plane perpendicular to the first direction, and the first and second floating electrodes are alternately arranged along the first direction.

2. The memory of claim 1, wherein the second floating electrodes have the planar shapes which are mirror-symmetric to the planar shapes of the first floating electrodes.

3. The memory of claim 1, wherein a distance between the first control electrode and the first floating electrodes, and a distance between the second control electrode and the second floating electrodes are in a range of 3 to 5 nm.

4. The memory of claim 1, wherein each of the first and second floating electrodes has the planar shape of a right triangle having a first side which is parallel to the first direction, a second side which is parallel to the second direction, and a third side which is nonparallel to the first and second directions.

5. The memory of claim 4, wherein the first side is longer than the second side.

6. The memory of claim 4, wherein a distance between an angular portion between the second side and the third side of a first floating electrode and the third side of the second floating electrode is in a range of 3 to 5 nm.

7. The memory of claim 1, wherein
each of the first floating electrodes comprises a first linear electrode portion which linearly extends from a vicinity of the first control electrode to the second control electrode, and
each of the second floating electrodes comprises a second linear electrode portion which linearly extends from a vicinity of the second control electrode to the first control electrode.

8. The memory of claim 7, wherein each of the first and second linear electrode portions is a whisker, a nanowire, or a nanotube.

9. The memory of claim 1, further comprising first insulating layers provided between the first control electrode and the first floating electrodes and between the second control electrode and the second floating electrodes.

10. The memory of claim 9, wherein the first insulating layers have a higher permittivity than a silicon oxide film.

11. The memory of claim 9, further comprising a second insulating layer provided between the first floating electrodes and the second floating electrodes, and having a lower permittivity than the first insulating layers.

12. The memory of claim 1, wherein a permittivity of an insulator between the first or second control electrode and a first or second floating electrode in a first stage is lower than a permittivity of an insulator between the first or second control electrode and first or second floating electrodes in second and subsequent stages.

13. The memory of claim 1, wherein a thickness of an insulator between the first or second control electrode and a first or second floating electrode in a first stage is smaller than a thickness of an insulator between the first or second control electrode and first or second floating electrodes in second and subsequent stages.

14. The memory of claim 1, wherein the first or second control electrode is electrically connected to a first or second floating electrode in a first stage.

15. The memory of claim 1, wherein
a voltage is applied to at least one of the first and second control electrodes to transmit charges in a first floating electrode to a second floating electrode which is adjacent to the first floating electrode in the first direction, and
a voltage is applied to at least the other control electrode of the first and the second control electrodes to transmit charges in a second floating electrode to a first floating electrode which is adjacent to the second floating electrode in the first direction.

16. The memory of claim 15, wherein
charges in a first floating electrode is transmitted to a second floating electrode which is adjacent to the first floating electrode in a positive or negative side of the first direction, and
charges in a second floating electrode is transmitted to a first floating electrode which is adjacent to the second floating electrode in the same side of the first direction.

17. The memory of claim 1, wherein the first and second floating electrodes comprises:
a first end floating electrode arranged at a first end among the first and second control electrodes; and
a second end floating electrode arranged at a second end among the first and second control electrodes,
wherein the memory further comprises an interconnect configured to transfer charges which are transmitted from the first end floating electrode to the second end floating electrode, to the first end floating electrode.

* * * * *